US012574032B2

(12) United States Patent
Gong et al.

(10) Patent No.: US 12,574,032 B2
(45) Date of Patent: Mar. 10, 2026

(54) CIRCUIT UNIT, LOGIC CIRCUIT, PROCESSOR, AND COMPUTING APPARATUS

(71) Applicant: SHENZHEN MICROBT ELECTRONICS TECHNOLOGY CO., LTD., Guangdong (CN)

(72) Inventors: Chuan Gong, Guangdong (CN); Wenbo Tian, Guangdong (CN); Zhijun Fan, Guangdong (CN); Zuoxing Yang, Guangdong (CN); Haifeng Guo, Guangdong (CN)

(73) Assignee: SHENZHEN MICROBT ELECTRONICS TECHNOLOGY CO., LTD., Guangdonn (CN)

( * ) Notice: Subject to any disclaimer, the term of this patent is extended or adjusted under 35 U.S.C. 154(b) by 195 days.

(21) Appl. No.: 18/283,198

(22) PCT Filed: Apr. 12, 2023

(86) PCT No.: PCT/CN2023/087745
§ 371 (c)(1),
(2) Date: Sep. 20, 2023

(87) PCT Pub. No.: WO2023/207586
PCT Pub. Date: Nov. 2, 2023

(65) Prior Publication Data
US 2025/0038749 A1 Jan. 30, 2025

(30) Foreign Application Priority Data

Apr. 28, 2022 (CN) .......................... 202210455794.5

(51) Int. Cl.
| *H03K 19/094* | (2006.01) |
| *H03K 19/0185* | (2006.01) |
| *H03K 19/0948* | (2006.01) |

(52) U.S. Cl.
CPC . *H03K 19/09429* (2013.01); *H03K 19/01855* (2013.01); *H03K 19/0948* (2013.01)

(58) Field of Classification Search
CPC ........... H03K 19/0016; H03K 19/0185; H03K 19/01855; H03K 19/018592;
(Continued)

(56) References Cited

U.S. PATENT DOCUMENTS

| 1,069,017 A | | 7/1913 | Lassen et al. | |
| 5,463,340 A | * | 10/1995 | Takabatake | ...... H03K 3/356156 |
| | | | | 377/79 |

(Continued)

FOREIGN PATENT DOCUMENTS

| CA | 3181301 A1 | 12/2021 |
| CN | 103166602 A | 6/2013 |

(Continued)

OTHER PUBLICATIONS

International Search Report and Written Opinion for PCT/CN2023/087745 dated Dec. 4, 2023 (10 pages).
(Continued)

*Primary Examiner* — Jason M Crawford
(74) *Attorney, Agent, or Firm* — Merchant & Gould P.C.

(57) ABSTRACT

The present disclosure relates to a circuit unit, a logic circuit, a processor, and a computing apparatus. A circuit unit is provided, including: an output terminal (OUT); an output stage (105), configured to provide an output signal to the output terminal; a first node (A), to which an input of the output stage is connected; and a feedback stage (107) that receives the output signal at the output terminal and selectively provides feedback to the node. A logic circuit is further provided, including an input stage that receives a signal input, and the circuit unit. The first node receives a signal based on an output of the input stage.

20 Claims, 16 Drawing Sheets

(58) Field of Classification Search

CPC ....... H03K 19/09425; H03K 19/09429; H03K 19/0948; H03K 3/012; H03K 3/037; H03K 3/356165

See application file for complete search history.

(56) References Cited

U.S. PATENT DOCUMENTS

| | | | | |
|---|---|---|---|---|
| 5,883,529 | A | 3/1999 | Kumata et al. | |
| 6,211,713 | B1 * | 4/2001 | Uhlmann | H03K 3/012 |
| | | | | 327/201 |
| 6,445,236 | B1 * | 9/2002 | Bernard | H03K 3/35625 |
| | | | | 327/202 |
| 6,538,471 | B1 * | 3/2003 | Stan | H03K 3/356008 |
| | | | | 326/46 |
| 6,605,971 | B1 * | 8/2003 | Burr | H03K 3/356165 |
| | | | | 327/214 |
| 6,906,558 | B2 | 6/2005 | Lee et al. | |
| 9,148,149 | B2 * | 9/2015 | Cheng | H03K 19/09429 |
| 9,461,633 | B1 * | 10/2016 | Foroudi | H03M 9/00 |
| 9,641,159 | B1 * | 5/2017 | Liao | H03K 3/0372 |
| 10,355,671 | B1 * | 7/2019 | Mao | H03K 3/35625 |
| 10,659,017 | B1 * | 5/2020 | Rengarajan | H03K 3/0372 |
| 10,819,343 | B2 * | 10/2020 | Bramnik | H03K 3/35625 |
| 10,840,892 | B1 * | 11/2020 | Rengarajan | H03K 3/012 |
| 11,296,684 | B2 | 4/2022 | Lu et al. | |
| 11,863,188 | B2 * | 1/2024 | Kang | H03K 3/35625 |
| 12,009,817 | B2 * | 6/2024 | Ioki | H03K 19/0948 |
| 2003/0128055 | A1 * | 7/2003 | Lin | H03F 3/345 |
| | | | | 327/57 |
| 2004/0113673 | A1 | 6/2004 | Lee et al. | |
| 2006/0017483 | A1 | 1/2006 | Kim | |
| 2009/0058485 | A1 * | 3/2009 | Berzins | H03K 3/356008 |
| | | | | 327/203 |
| 2012/0229187 | A1 * | 9/2012 | Choudhury | G11C 11/4125 |
| | | | | 327/202 |
| 2013/0147534 | A1 * | 6/2013 | Cheng | H03K 3/35625 |
| | | | | 327/202 |
| 2013/0307595 | A1 * | 11/2013 | Koo | H03K 3/012 |
| | | | | 327/142 |
| 2014/0232439 | A1 | 8/2014 | Bartling et al. | |
| 2014/0285236 | A1 * | 9/2014 | Cheng | H03K 19/09429 |
| | | | | 326/58 |
| 2014/0347114 | A1 * | 11/2014 | Bartling | H03K 3/012 |
| | | | | 327/203 |
| 2015/0200651 | A1 * | 7/2015 | Baratam | H03K 3/012 |
| | | | | 327/202 |
| 2015/0381154 | A1 * | 12/2015 | Maeno | H03K 3/35625 |
| | | | | 327/203 |
| 2016/0094204 | A1 * | 3/2016 | Nandi | H03K 3/0372 |
| | | | | 327/203 |
| 2016/0191028 | A1 * | 6/2016 | Das | H03K 3/0372 |
| | | | | 327/202 |
| 2018/0088176 | A1 * | 3/2018 | Uemura | G01R 31/318552 |
| 2019/0372563 | A1 * | 12/2019 | Mao | H03K 3/013 |
| 2020/0143851 | A1 * | 5/2020 | Holm | G11C 7/106 |
| 2021/0184659 | A1 * | 6/2021 | Subbannavar | H03K 3/35625 |
| 2021/0194469 | A1 | 6/2021 | Agarwal et al. | |
| 2021/0305975 | A1 | 9/2021 | Lu et al. | |
| 2022/0173725 | A1 * | 6/2022 | Bhat | H03K 3/012 |
| 2022/0239288 | A1 | 7/2022 | Lu et al. | |
| 2022/0397607 | A1 * | 12/2022 | Kang | G11C 7/222 |
| 2023/0050338 | A1 * | 2/2023 | Kong | H03K 3/35625 |
| 2023/0238947 | A1 | 7/2023 | Tian et al. | |
| 2023/0396241 | A1 * | 12/2023 | Kim | H03K 3/0372 |
| 2024/0314468 | A1 * | 9/2024 | Wang | H03K 23/58 |
| 2024/0364316 | A1 * | 10/2024 | Tian | H03K 3/012 |
| 2024/0388281 | A1 * | 11/2024 | Fan | H03K 3/356156 |
| 2024/0396534 | A1 * | 11/2024 | Gong | H03K 19/0016 |
| 2025/0038749 | A1 * | 1/2025 | Gong | H03K 19/01855 |
| 2025/0080091 | A1 * | 3/2025 | Tran | H10D 86/201 |

FOREIGN PATENT DOCUMENTS

| | | |
|---|---|---|
| CN | 208608968 U | 3/2019 |
| CN | 110708041 A | 1/2020 |
| CN | 111600577 A | 8/2020 |
| CN | 113054955 A | 6/2021 |
| CN | 114567296 A | 5/2022 |
| JP | 2021100237 A | 7/2021 |
| KR | 20040051935 A | 6/2004 |
| KR | 2021-0039337 A | 4/2021 |
| WO | 2019236224 A1 | 12/2019 |

OTHER PUBLICATIONS

First Chinese Office Action issued on Jun. 9, 2022 for CN Application No. 202210455794.5 (24 pages including English Translation).

Second Chinese Office Action issued on Jul. 12, 2022 for CN Application No. 202210455794.5 (22 pages including English Translation).

Notice of Allowance issued on Aug. 18, 2022 for CN Application No. 202210455794.5 (6 pages including English Translation).

First Office Action dated Apr. 18, 2024 for TW Application No. 112113607 (24 pages including English Translation).

First Office Action dated Dec. 6, 2024 for corresponding KR application 10-2023-7031217 (19 pages including English Translation).

* cited by examiner

100

200

200B

200C

200D

200E

600A

600B

700

CIRCUIT UNIT, LOGIC CIRCUIT, PROCESSOR, AND COMPUTING APPARATUS

CROSS-REFERENCE TO RELATED APPLICATIONS

This application is a National Stage Application of International Application No. PCT/CN2023/087745, filed 12 Apr. 2023, which claims benefit of Serial No. 202210455794.5, filed 28 Apr. 2022 in China, and which applications are incorporated herein by reference. To the extent appropriate, a claim of priority is made to each of the above disclosed applications.

TECHNICAL FIELD

The present disclosure relates to a circuit unit, a logic circuit, a processor, and a computing apparatus.

BACKGROUND

Digital currencies have received increasing attention in recent years. In a related field, a chip processor and a computing apparatus that are used for a digital currency need to be improved.

Flip-flops and latches are widely used in chips and can be used as registers, shift registers, frequency dividers, and waveform generators for digital signals. Dynamic flip-flops and latches greatly simplify their circuit structures by reducing feedback circuits used to maintain an operating state, which reduces both a chip area and power consumption, and therefore the dynamic flip-flops and latches are used in chips in large quantities, especially in high-performance computing chips. Because there are nodes in the dynamic flip-flops and latches that are suspended for a part of time, during which a parasitic capacitor at each of those nodes needs to maintain a correct voltage state. To prevent device electric leakage from affecting the voltage at this node, the dynamic flip-flops and latches are usually limited to the lowest operating frequency. When the chip has an application that dynamically adjusts the operating frequency, for example, in high-performance mode, the chip operates at the highest operating frequency. In power-saving or special mode, it may be necessary to reduce the operating frequency as much as possible to achieve optimum power consumption. However, the dynamic flip-flops and latches of the related art are difficult to meet applications in both high and low frequency modes.

In addition, to reduce or avoid that device electric leakage affects the voltage of the node, a circuit device connected to the node needs to use a low electric leakage device. Low electric leakage devices are typically high threshold devices that are slower than low threshold devices in speed, which affects the speed of flip-flops and latches.

To resolve the foregoing one or more problems, the present disclosure provides a circuit unit, a logic circuit, a processor, and a computing apparatus.

SUMMARY

According to an aspect of the present disclosure, a circuit unit is provided, including: an output terminal (OUT); an output stage (105), configured to provide an output signal to the output terminal; a first node (A), wherein an input of the output stage is connected to the first node; and a feedback stage (107) that receives the output signal at the output terminal and selectively provides feedback to the node.

In some embodiments, the feedback stage further receives a first clock signal, a second clock signal, and an enable signal, and the first clock signal is an inverse of the second clock signal; wherein the feedback stage has a logic high state, a logic low state, and a high impedance state; wherein the enable signal is set such that the feedback stage can provide feedback based on the first clock signal, the second clock signal, and the output signal when the enable signal is valid, and the feedback stage presents a high impedance state and therefore does not provide feedback when the enable signal is invalid; and wherein an output of the output stage is inverted to the input of the output stage.

In some embodiments, the feedback stage includes a three-state gate, and the three-state gate includes: first to sixth transistors serially connected in sequence, wherein the first transistor, the second transistor, and the third transistor are transistors of a first conductivity type, the fourth transistor, the fifth transistor, and the sixth transistor are transistors of a second conductivity type, and the second conductivity type is different from the first conductivity type; wherein in the first transistor, the second transistor, and the third transistor, a control terminal of one of the transistors is connected to the output terminal, a control terminal of a different one of the transistors is connected to one of the first clock signal and the second clock signal, and a control terminal of another different one of the transistors is connected to one of the enable signal and an inverse of the enable signal; wherein in the fourth transistor, the fifth transistor, and the sixth transistor, a control terminal of one of the transistors is connected to the output terminal, a control terminal of a different one of the transistors is connected to the other one of the first clock signal and the second clock signal, and a control terminal of another different one of the transistors is connected to the other one of the enable signal and the inverse of the enable signal; and wherein a second node at which the third transistor and the fourth transistor are connected to each other is connected to the first node.

In some embodiments, the feedback stage includes a three-state gate and a transmission gate that are serially connected; an input of the three-state gate is connected to the output terminal, an output of the three-state gate is connected to an input of the transmission gate, and an output of the transmission gate is connected to the first node; two control terminals of the transmission gate respectively receive the first clock signal and the second clock signal; the three-state gate includes: seventh to tenth transistors serially connected in sequence, wherein the seventh transistor and the eighth transistor are transistors of a first conductivity type, and the ninth transistor and the tenth transistor are transistors of a second conductivity type; wherein a control terminal of one of the seventh transistor and the eighth transistor is connected to the output terminal, and a control terminal of the other of the seventh transistor and the eighth transistor is connected to one of the enable signal and an inverse of the enable signal; wherein a control terminal of one of the ninth transistor and the tenth transistor is connected to the output terminal, and a control terminal of the other of the ninth transistor and the tenth transistor is connected to the other of the enable signal and the inverse of the enable signal; and wherein a nodes at which the eighth transistor and the ninth transistor are connected to each other is connected to the input of the transmission gate.

In some embodiments, the feedback stage further receives a third clock signal (CLKP') and a fourth clock signal (CLKN'), and the third clock signal is an inverse of the fourth clock signal, wherein each of the third clock signal and the fourth clock signal is a logical combination of a clock signal (CK) and an enable signal (EN) which are externally provided; wherein the feedback stage has a logic high state, a logic low state, and a high impedance state. The third clock signal and the fourth clock signal are configured such that: when the enable signal is valid, the feedback stag can provide feedback based on the clock signal, an inverse of the clock signal, and the output signal; and when the enable signal is invalid, the feedback stage presents a high impedance state and thus does not provide feedback; wherein an output of the output stage is inverted to the input of the output stage.

In some embodiments, the feedback stage includes a three-state gate, and the three-state gate includes: first to fourth transistors serially connected in sequence, wherein the first transistor and the second transistor are transistors of a first conductivity type, and the third transistor and the fourth transistor are transistors of a second conductivity type, wherein the second conductivity type is different from the first conductivity type; wherein a control terminal of one of the first transistor and the second transistor is connected to the output terminal, and a control terminal of the other of the first transistor and the second transistor is connected to the third clock signal; wherein a control terminal of one of the third transistor and the fourth transistor is connected to the output terminal, and a control terminal of the other of the third transistor and the fourth transistor is connected to the fourth clock signal; and wherein a node at which the second transistor and the third transistor are connected to each other is connected to the first node.

In some embodiments, the feedback stage includes an inverter and a transmission gate that are serially connected; the inverter includes a first transistor of a first conductivity type and a fourth transistor of a second conductivity type that are connected in series, the transmission gate includes a second transistor of the first conductivity type and a third transistor of the second conductivity type that are connected in parallel, and the second conductivity type is different from the first conductivity type; an input of the inverter is connected to the output terminal, an output of the inverter is connected to an input of the transmission gate, and an output of the transmission gate is connected to the first node; and two control terminals of the transmission gate respectively receive the third clock signal and the fourth clock signal.

In some embodiments, the first conductivity type is P-type, and the second conductivity type is N-type.

According to an aspect of the present disclosure, a logic circuit is further provided, including: an input stage, receiving a signal input; and the circuit unit according to any embodiment, wherein the first node receives a signal based on an output of the input stage.

In some embodiments, the logic circuit further includes: an intermediate stage, disposed between the input stage and the circuit unit, wherein the intermediate stage receives an output of the input stage as an input, and provides an output to the first node.

In some embodiments, the input stage further includes at least one of the followings: an inverter, wherein the inverter receives an input of the flip-flop, and provides an output to the intermediate stage; and three-state logic, wherein the three-state logic receives the signal input and first and second clock signals, and provides an output to the intermediate stage, and the three-state logic presents a logic high state, a logic low state, and a high impedance state according to the input and the first and second clock signals.

In some embodiments, the intermediate stage is three-state logic, the three-state logic receives the output of the input stage and the first clock signal and the second clock signal, and the three-state logic presents a logic high state, a logic low state, and a high impedance state according to the input and the first clock signal and the second clock signal.

In some embodiments, the three-state logic includes an inverter and a transmission gate, the inverter receives the output of the input stage as an input, an output of the inverter is connected to one terminal of the transmission gate, the other terminal of the transmission gate is connected to the first node, and control terminals of the transmission gate separately receive the first and second clock signals.

In some embodiments, the three-state logic includes a three-state gate, and the three-state gate includes: eleventh to fourteenth transistors serially connected in sequence, wherein the eleventh and twelfth transistors are transistors of a first conductivity type, and the thirteenth and fourteenth transistors are transistors of a second conductivity type; wherein a control terminal of one of the eleventh and twelfth transistors is connected to the output of the input stage, and a control terminal of the other of the eleventh and twelfth transistors is connected to one of the first and second clock signals; wherein a control terminal of one of the thirteenth and fourteenth transistors is connected to the output of the input stage, and a control terminal of the other of the thirteenth and fourteenth transistors is connected to the other of the first and second clock signals; and wherein a node at which the twelfth and thirteenth transistors are connected to each other is connected to the first node.

In some embodiments, the input stage includes three-state logic, and the three-state logic receives the signal input and first and second clock signals and provides an output to the first node; the three-state logic presents a logic high state, a logic low state, and a high impedance state according to the input and the first and second clock signals, wherein the logic circuit is a non-inverting latch.

In some embodiments, the input stage includes a transmission gate, one terminal of the transmission gate receives the signal input, the other terminal of the transmission gate is connected to the first node, and control terminals of the transmission gate separately receive first and second clock signals; and the logic circuit is an inverting latch.

In some embodiments, the input stage includes the three-state logic, and the logic circuit is an inverting flip-flop.

In some embodiments, the intermediate stage is three-state logic, the three-state logic receives the output of the input stage and first and second clock signals, and the three-state logic presents a logic high state, a logic low state, and a high impedance state according to the received output of the input stage and the first and second clock signals; the input stage includes a transmission gate, one terminal of the transmission gate receives the signal input, the other terminal of the transmission gate is connected to a first node A, and control terminals of the transmission gate separately receive the first and second clock signals; and the logic circuit is a non-inverting flip-flop.

In some embodiments, thresholds of transistors in the logic circuit are substantially the same.

According to an aspect of the present disclosure, a processor is provided, including: the circuit unit or logic circuit according to any embodiment of the present disclosure.

According to an aspect of the present disclosure, a computing apparatus is provided, including the processor according to any embodiment of the present disclosure. In some embodiments, the computing apparatus is used for digital currencies. The processor and the computing apparatus according to the present disclosure can be used for computation associated with digital currencies, such as bitcoin, Litecoin, ETH and other digital currencies.

Other features and advantages of the present disclosure will become apparent from the following detailed description of exemplary embodiments of the present disclosure with reference to the accompanying drawings.

BRIEF DESCRIPTION OF THE DRAWINGS

The accompanying drawings, which form a part of the specification, describe embodiments of the present disclosure and, together with the specification, are used to explain the principles of the present disclosure.

Referring to the accompanying drawings, the present disclosure may be more clearly understood according to the following detailed description.

Figure 1:
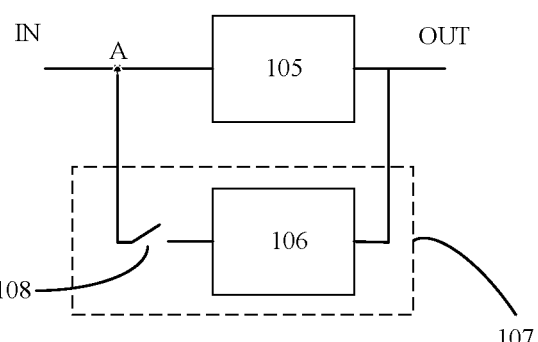
FIG. 1 shows a schematic block diagram of a circuit unit according to some embodiments of the present disclosure.

Note that in the implementation described below, sometimes a same reference numeral is used in common between different accompanying drawings to indicate a same part or a part with a same function, and repeated description thereof is omitted. In this specification, similar numbers and letters are used to denote similar items. Therefore, once an item is defined in an accompanying drawing, further discussion for it is not required in the following drawings.

For ease of understanding, a location, a size, a range, and the like of each structure shown in the accompanying drawings sometimes do not indicate an actual location, size, range, and the like. Therefore, the disclosed invention is not limited to a location, a size, a range, and the like disclosed in the accompanying drawings and the like.

DETAILED DESCRIPTION

Various exemplary embodiments of the present disclosure will now be described in detail with reference to the accompanying drawings. It should be noted that the relative arrangement of components and steps, numerical expressions, and numerical values set forth in these embodiments do not limit the scope of the present disclosure unless otherwise specified. In addition, techniques, methods, and devices known to those of ordinary skill in the relevant art may not be discussed in detail, but where appropriate, such techniques, methods, and devices should be considered as a part of the specification as authorized.

It should be understood that the following description of at least one exemplary embodiment is merely illustrative and is not intended to limit the present disclosure or its application or use. It should also be understood that any implementation described here by way of example does not necessarily mean that it is preferred or advantageous over other implementations. The present disclosure is not limited by any expressed or implied theory provided in the foregoing technical field, background, summary, or detailed description.

In this specification, "three-state logic" means a logic circuit whose output presents three states according to an input and a control signal: a logic high state, a logic low state, and a high impedance state. The control signal may be, for example, a clock signal.

In this specification, a "three-state gate" means a logic gate (also referred to as a logic gate circuit) of a "minimum level" whose output can implement the three states (logic high state, logic low state, and high impedance state). Here, "a logic gate of a minimum-level" means that no independent logic gate or logic unit can be separated from the logic gate (three-state gate) as its part.

In addition, for the purpose of reference only, a term may be used in the following description, and therefore is not intended to be limited. For example, the words "first," "second" and other such numeric words involving a structure or element do not imply an order or sequence unless the context expressly indicates otherwise.

It should also be understood that when the word "include/comprise" is used in this specification, it indicates the presence of the indicated feature, whole, step, operation, unit, and/or component, but the presence or addition of one or more other features, wholes, steps, operations, units, and/or components, and/or a combination thereof is not excluded.

FIG. 1 shows a schematic block diagram of a circuit unit according to some embodiments of the present disclosure. As shown in FIG. 1, a circuit unit 100 according to embodiments of the present disclosure includes an output stage 105 and a feedback stage (or a feedback path) 107. The output stage 105 is arranged between a node A and an output terminal OUT to receive a signal (e.g., a voltage signal) IN at the node A and provide an output signal to the output terminal OUT.

The feedback stage 107 receives the output signal at the output terminal and selectively (e.g., via a switch 108) provides feedback to the node A. As an illustration, the feedback stage 107 is shown here as including a feedback unit 106 and the switch 108. However, it should be understood that the block diagram shown in FIG. 1 is merely exemplary. The feedback path 107 including the feedback unit 106 and the switch 108 may be implemented in a plurality of different implementations to be equivalent to components and functions shown in the block diagram, and may not be limited to the implementation that includes the discrete feedback unit 106 and switch 108 as shown in the figure.

In an operation of the circuit unit 100, a potential of the node A may be floating in a part of a clock cycle. In some embodiments, the node A may be any node with suspended potential in a dynamic flip-flop or a dynamic latch. When the circuit unit needs to operate in a high speed mode, the switch 108 can be opened (turned off) so that the node A outputs data to the output terminal OUT through the output stage 105. When the circuit unit needs to operate in an energy saving mode or other special modes, the switch 108 may be closed (turned on), and the signal at the node A is latched by the feedback stage (or the feedback path) 107, so that data loss of the node A is not caused due to current leakage. Therefore, the circuit unit can operate at lower operating frequency.

Figure 2:
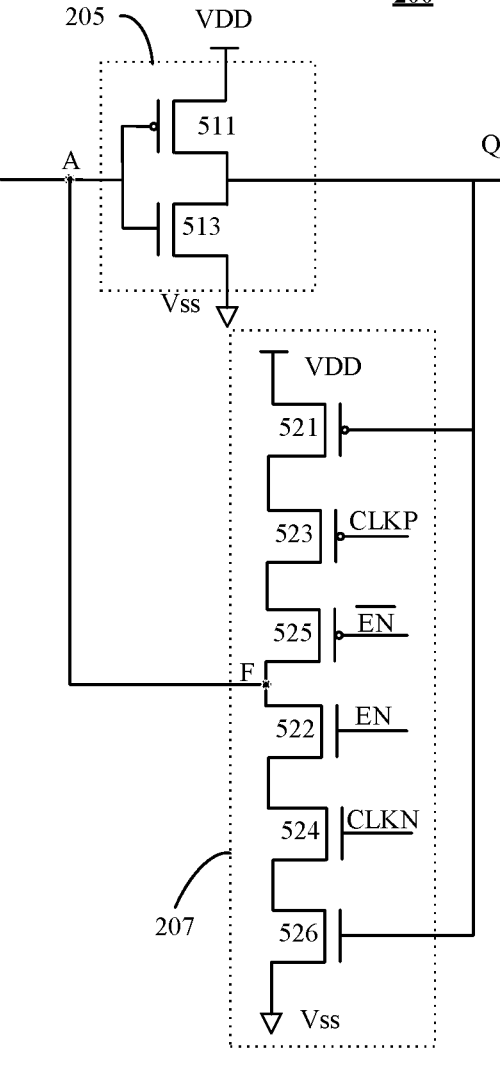
FIG. 2 shows a schematic circuit diagram of a circuit unit according to some embodiments of the present disclosure.

FIG. 2 shows a schematic circuit diagram of a specific implementation of a circuit unit according to some embodiments of the present disclosure. A circuit unit 200 according to this implementation includes an output stage 205 and a feedback stage 207.

Here, the output stage 205 is implemented as an inverter so that its output Q is an inverse of the input (i.e., the signal at the node A). In the embodiment shown in FIG. 2, the output stage 205 includes CMOS transistors 511 and 513 serially connected to each other. The transistor 511 is a PMOS transistor, and the transistor 513 is an NMOS transistor. A control terminal (gate) of the transistor 511 is connected to the node A, its source is connected to a supply voltage VDD, and its drain is connected to a drain of the transistor 513 and is connected to the output terminal Q. A gate of transistor 513 is connected to the node A, and its source is connected to a low-potential supply voltage Vss (for example, ground).

The feedback stage 207 is implemented as three-state logic. As shown in the figure, the feedback stage 207 further receives a first clock signal (e.g., a clock signal CLKP or CLKN) and a second clock signal (e.g., a clock signal CLKN or CLKP) and an enable signal (EN and/or $\overline{EN}$). Here, the clock signals CLKP and CLKN are a pair of clock signals with same frequency but opposite phases. In other words, the clock signal CLKP and the clock signal CLKN are inverses of each other. The signal $\overline{EN}$ is an inverse of the signal EN.

The feedback stage 207 functions as three-state logic and has a logic high state, a logic low state, and a high impedance state. The enable signal is set such that the feedback stage can provide feedback based on the first clock signal, the second clock signal, and the output signal when the enable signal is valid, and the feedback stage exhibits a high impedance state and therefore does not provide feedback when the enable signal is invalid.

In the embodiment shown in FIG. 2, the feedback stage 207 is implemented as a three-state gate. The three-state gate 207 includes first to sixth transistors 521, 523, 525, and 522, 524, and 526 that are serially connected in sequence. Here, the first, second, and third transistors 521, 523, 525 are transistors of a first conductivity type (for example, a P-type), and the fourth, fifth, and sixth transistors 522, 524, 526 are transistors of a second conductivity type (for example, an N-type), which has a different conductivity type.

In the first to third transistors 521, 523, 525, a control terminal (here, a gate) of one of the transistors (here, the transistor 521) is connected to the output terminal Q; a control terminal (gate) of a different one of the transistors (here, the transistor 523) is connected to one of the first clock signal and the second clock signal (here, CLKP); and a control terminal (gate) of another different one of the transistors (here, the transistor 525) is connected to one of the enable signal and an inverse of the enable signal (here, $\overline{EN}$).

In the fourth to sixth transistors 522, 524, 526, a control terminal (gate) of one of the transistors (here, the transistor 526) is connected to the output terminal Q; a control terminal (gate) of a different one of the transistors (here, the transistor 524) is connected to the other one (here, CLKN) of the first clock signal and the second clock signal; and a control terminal (gate) of another different one of the transistors (here, the transistor 522) is connected to the other of the enable signal and the inverse of the enable signal (here, EN).

One terminal of the transistor 521 (here, the source) is connected to the supply voltage VDD. The drain of the PMOS transistor 525 and the drain of the NMOS transistor 522 are connected to each other (a node F) and are connected to the node A. Another terminal of the transistor 526 (here, the source) is connected to a low potential Vss.

It should be understood that, although the feedback stage 207 is implemented as a three-state gate in the embodiment shown in FIG. 2, the feedback stage 207 may be implemented in a plurality of other manners in other embodiments.

FIG. 2A to FIG. 2G show schematic circuit diagrams of circuit units according to a plurality of embodiments of the present disclosure. Structures of circuit units 200A-200G of the embodiments shown in FIG. 2A-FIG. 2G are basically the same as the structure of the circuit unit 200 shown in FIG. 2, and a difference lies only in different signals connected to control terminals of respective transistors.

Figure 2A:
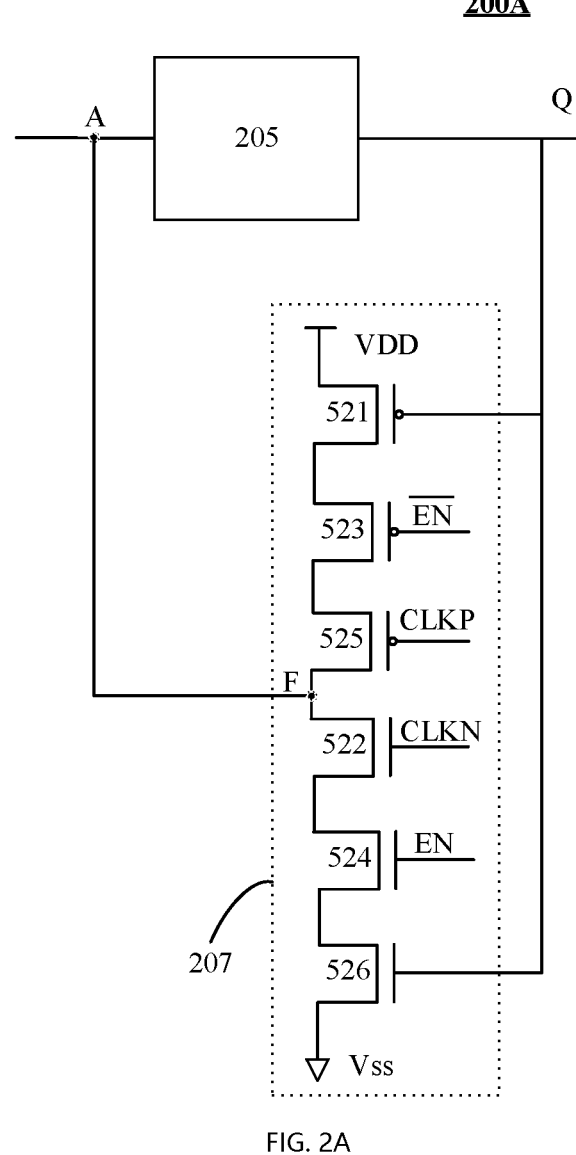
FIG. 2A to FIG. 2G show schematic circuit diagrams of circuit units according to a plurality of embodiments of the present disclosure.

In the circuit unit 200A shown in FIG. 2A, the control terminal (gate) of the transistor 521 is connected to the output terminal Q the control terminal (gate) of the transistor 523 is connected to the inverse $\overline{EN}$ of the enable signal, and the control terminal (gate) of the transistor 525 is connected to the clock signal CLKP. The control terminal (gate) of the transistor 526 is connected to the output terminal Q the control terminal (gate) of the transistor 524 is connected to the enable signal EN, and the control terminal (gate) of the transistor 522 is connected to the clock signal CLKN.

Figure 2B:
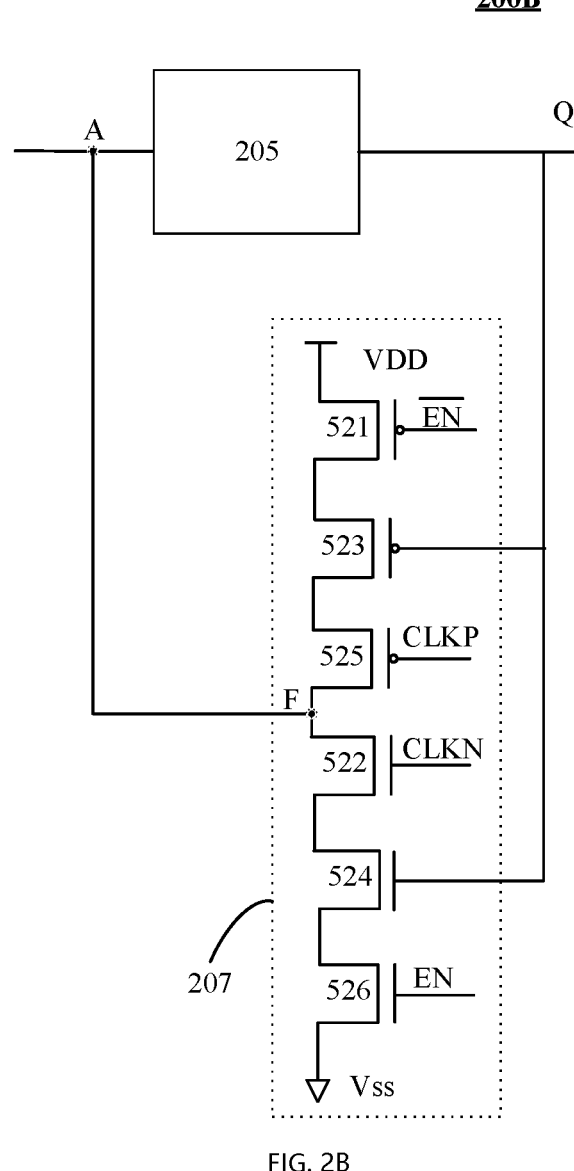

In the circuit unit 200B shown in FIG. 2B, the control terminal (gate) of the transistor 521 is connected to the inverse $\overline{EN}$ of the enable signal, the control terminal (gate) of the transistor 523 is connected to the output terminal Q, and the control terminal (gate) of the transistor 525 is connected to the clock signal CLKP. The control terminal (gate) of the transistor 526 is connected to the enable signal EN, the control terminal (gate) of the transistor 524 is connected to the output terminal Q, and the control terminal (gate) of the transistor 522 is connected to the clock signal CLKN.

Figure 2C:
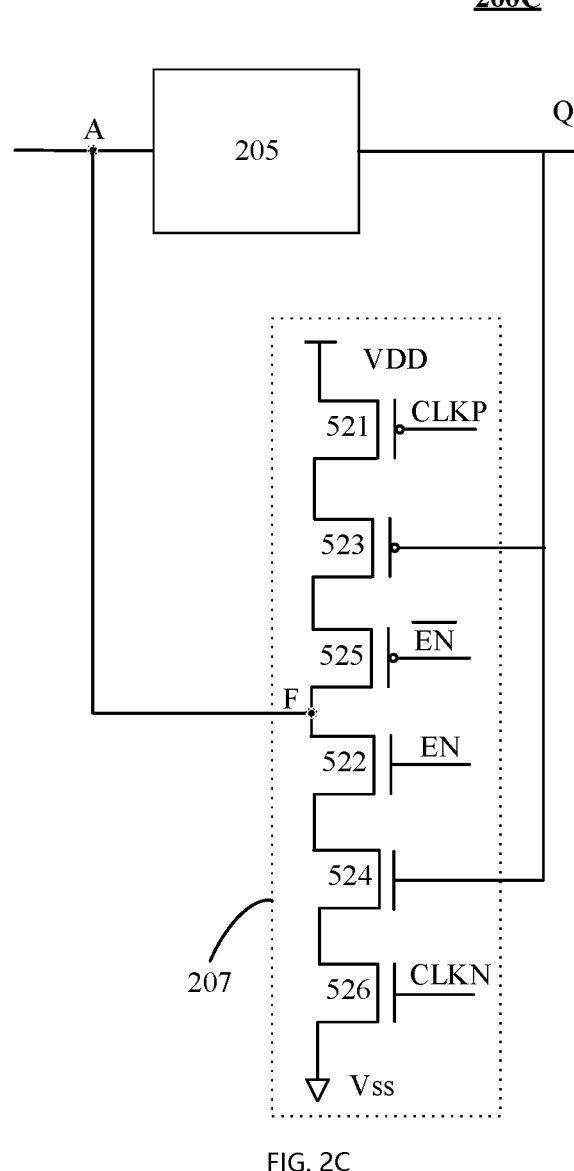

In the circuit unit 200C shown in FIG. 2C, the control terminal (gate) of the transistor 521 is connected to the clock signal CLKP, the control terminal (gate) of the transistor 523 is connected to the output terminal Q, and the control terminal (gate) of the transistor 525 is connected to the inverse $\overline{EN}$ of the enable signal. The control terminal (gate)

of the transistor 526 is connected to the clock signal CLKN, the control terminal (gate) of the transistor 524 is connected to the output terminal Q, and the control terminal (gate) of the transistor 522 is connected to the enable signal EN.

Figure 2D:
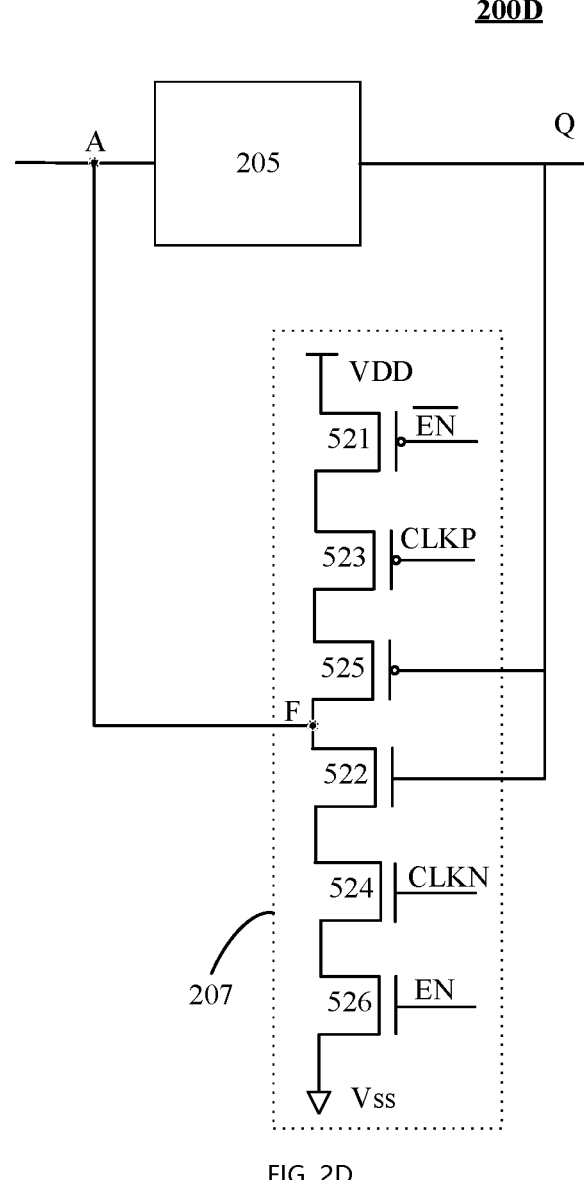

In the circuit unit 200D shown in FIG. 2D, the control terminal (gate) of the transistor 521 is connected to the inverse $\overline{EN}$ of the enable signal, the control terminal (gate) of the transistor 523 is connected to the clock signal CLKP, and the control terminal (gate) of the transistor 525 is connected to the output terminal Q. The control terminal (gate) of the transistor 526 is connected to the enable signal EN, the control terminal (gate) of the transistor 524 is connected to the clock signal CLKN, and the control terminal (gate) of the transistor 522 is connected to the output terminal Q.

Figure 2E:
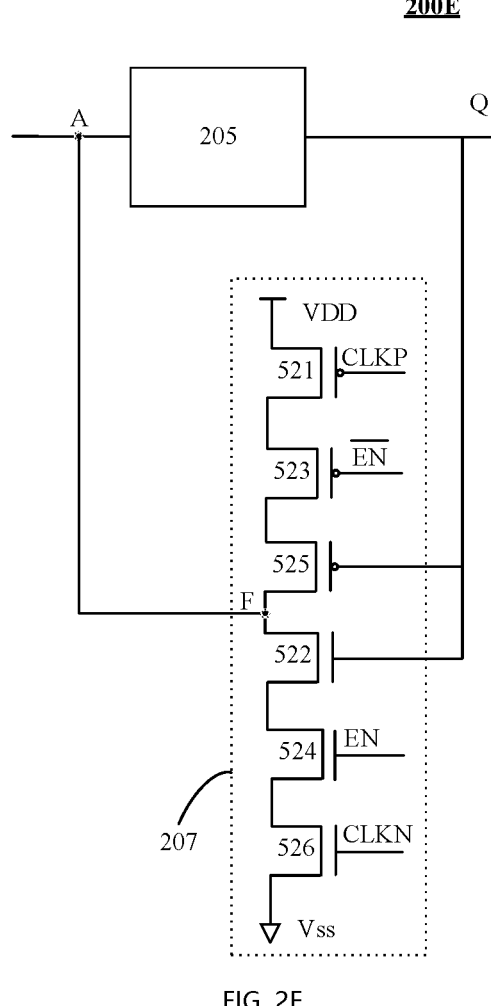

In the circuit unit 200E shown in FIG. 2E, the control terminal (gate) of the transistor 521 is connected to the clock signal CLKP, the control terminal (gate) of the transistor 523 is connected to the inverse $\overline{EN}$ of the enable signal, and the control terminal (gate) of the transistor 525 is connected to the output terminal Q. The control terminal (gate) of the transistor 526 is connected to the clock signal CLKN, the control terminal (gate) of the transistor 524 is connected to the enable signal EN, and the control terminal (gate) of the transistor 522 is connected to the output terminal Q.

Figure 2F:
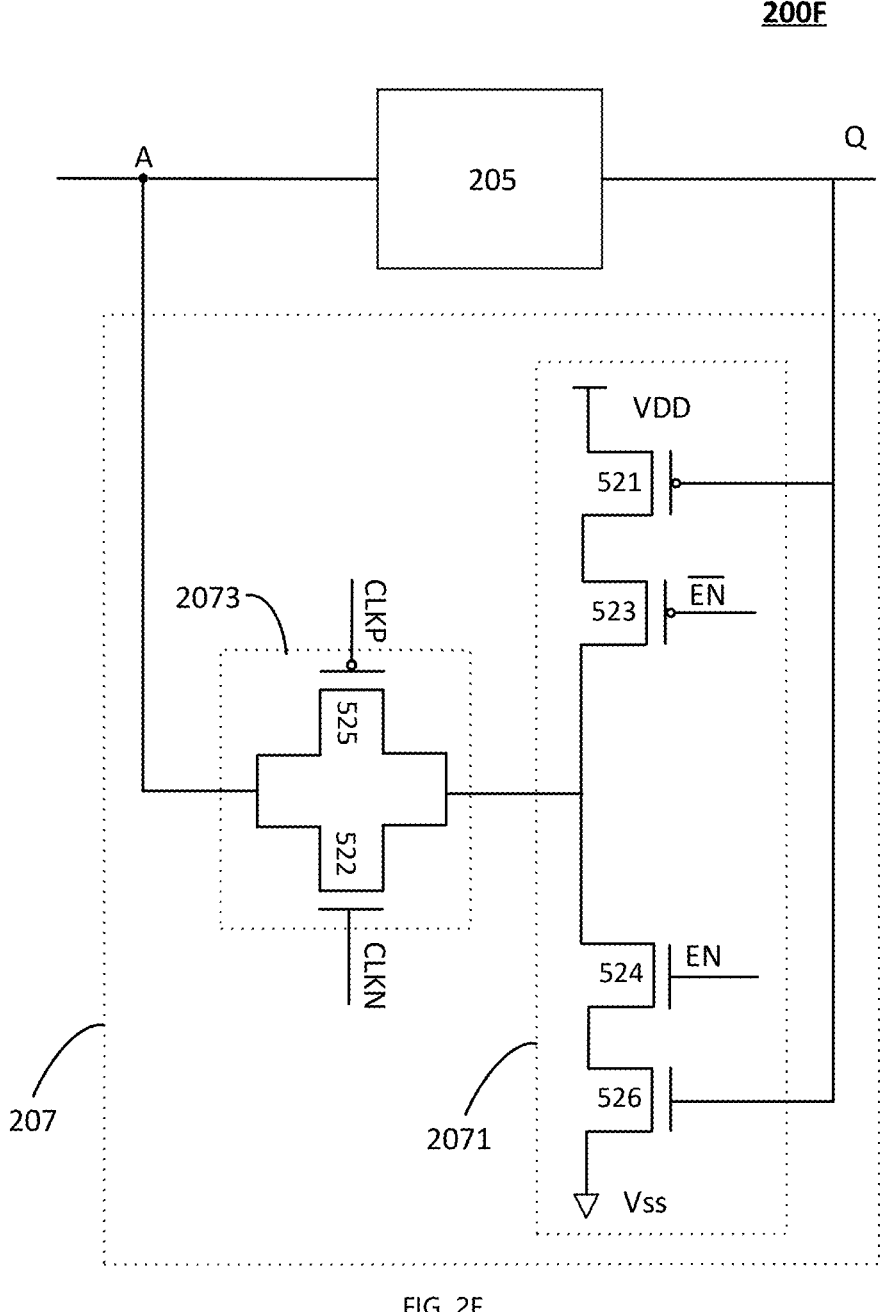

In the circuit unit 200F shown in FIG. 2F, the feedback stage 207 is implemented to include a three-state gate 2071 and a transmission gate 2073 that are serially connected. An input of the three-state gate 2071 is connected to the output terminal Q, an output of the three-state gate 2071 is connected to an input of the transmission gate 2073, and an output of the transmission gate 2073 is connected to the node A.

Here, the three-state gate 2071 includes fifth to eighth transistors 521, 523, 524, and 526 that are serially connected in sequence. The fifth and sixth transistors 521 and 523 are transistors of a first conductivity type (here, as an example, PMOS transistors), and the seventh and eighth transistors 524 and 526 are transistors of a second conductivity type (here, as an example, NMOS transistors). A control terminal of one of the fifth and sixth transistors 521 and 523 is connected to the output terminal Q and a control terminal of the other of the fifth and sixth transistors 521 and 523 is connected to one of the enable signal and the inverse of the enable signal. In the example shown in FIG. 2F, the control terminal of the transistor 521 is connected to the output terminal Q, and the control terminal of the transistor 523 is connected to the inverse $\overline{EN}$ of the enable signal. Similarly, the control terminal of one of the seventh and eighth transistors 524 and 526 is connected to the output terminal Q, and the control terminal of the other of the seventh and eighth transistors 524 and 526 is connected to the other of the enable signal and the inverse of the enable signal. In the example shown in FIG. 2F, the control terminal of the transistor 524 is connected to the enable signal EN, and the control terminal of the transistor 526 is connected to the output terminal Q. A node at which the sixth and seventh transistors 523 and 524 are connected to each other is connected to the input of the transmission gate 2073.

The transmission gate 2073 includes two CMOS transistors, which are labeled 525 and 522 as examples. Two control terminals of the transistors 525 and 522 respectively receive one of the first clock signal and the second clock signal. Here, the gate of the transistor 525 receives the clock signal CLKP, and the gate of the transistor 522 receives the clock signal CLKN.

Figure 2G:
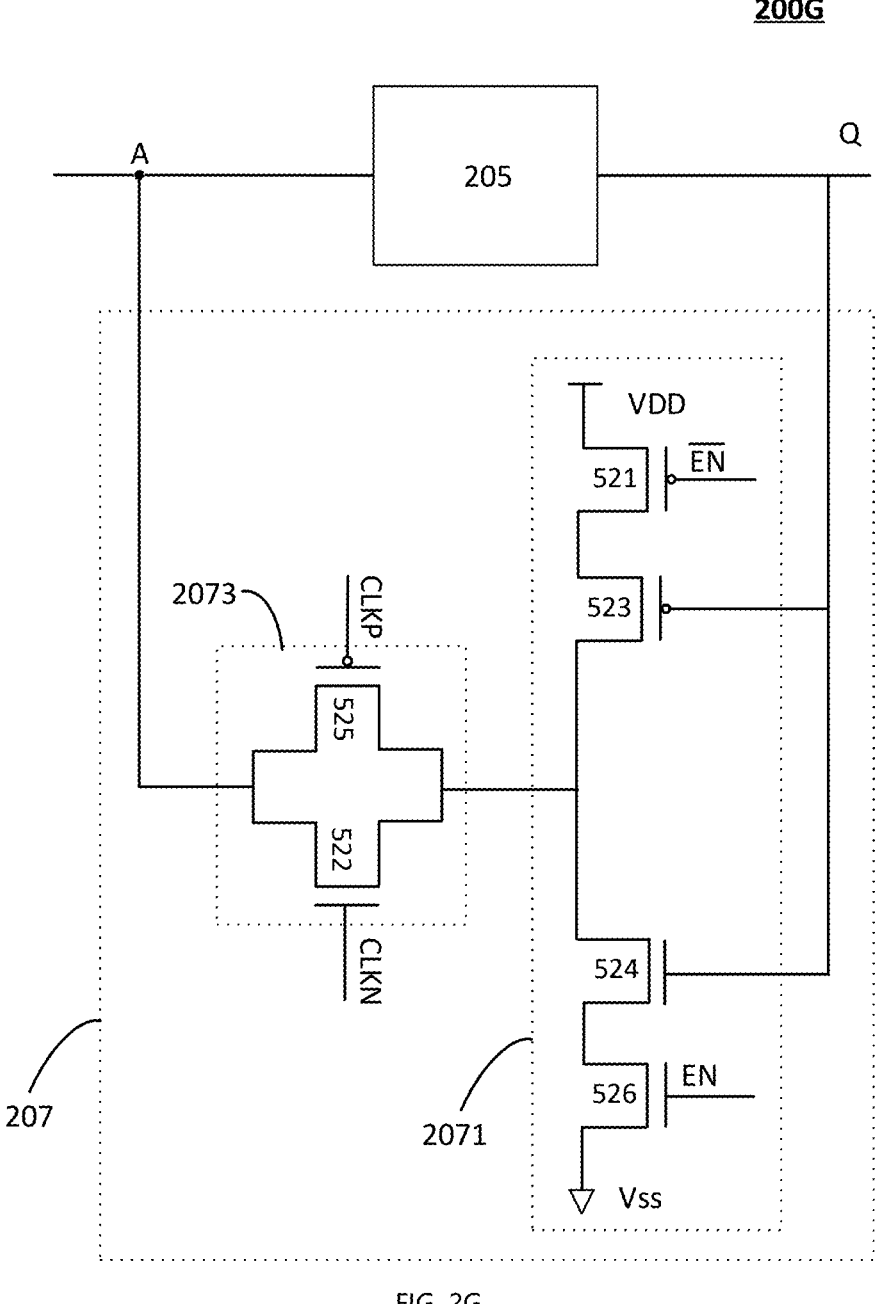

A difference between the circuit unit 200G shown in FIG. 2G and the circuit unit 200F shown in FIG. 2F lies only in different signals connected to the gates of the transistors in the three-state gate 2071. In the example shown in FIG. 2G, the control terminal of the transistor 521 is connected to the inverse $\overline{EN}$ of the enable signal, the control terminal of the transistor 523 is connected to the output terminal Q, the control terminal of the transistor 524 is connected to the output terminal Q, and the control terminal of the transistor 526 is connected to the enable signal EN.

Figure 3:
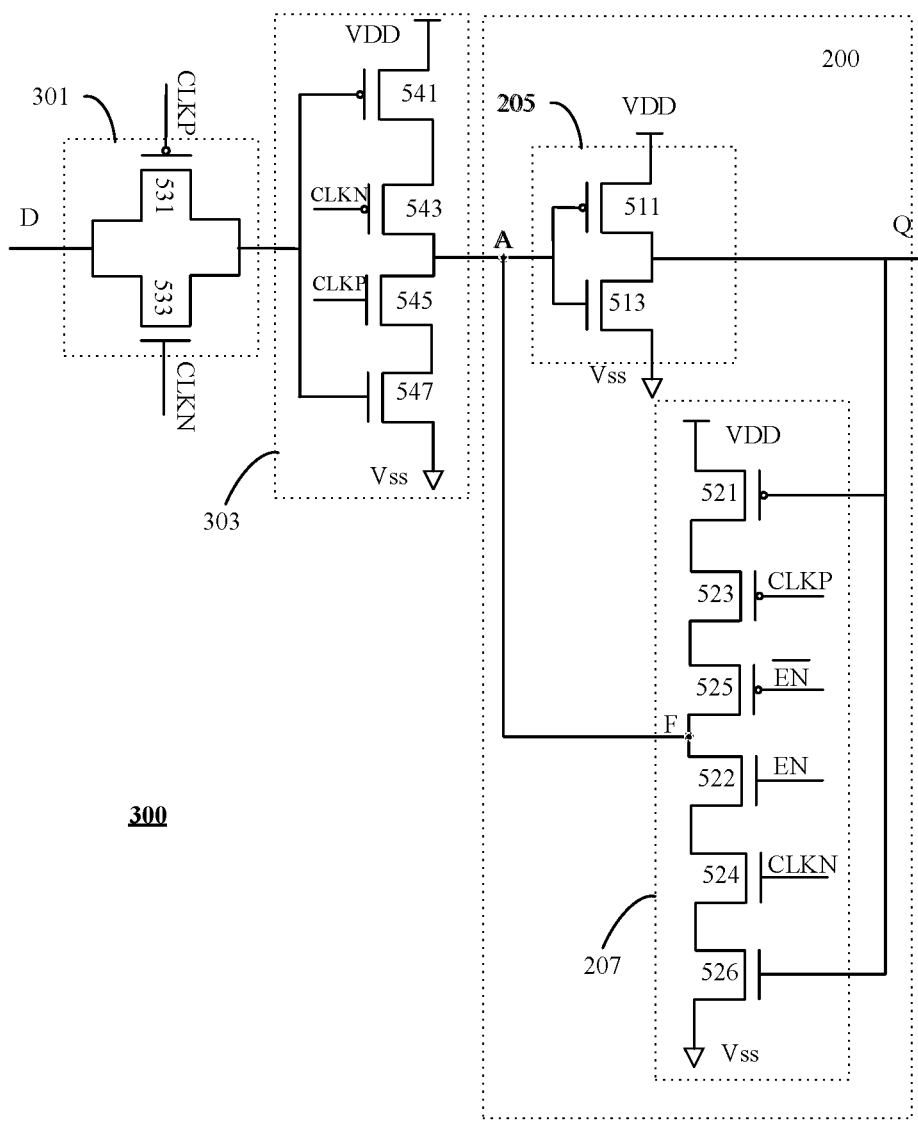
FIG. 3 shows a schematic circuit diagram of a flip-flop including a circuit unit according to some embodiments of the present disclosure.

FIG. 3 shows a schematic circuit diagram of a flip-flop including a circuit unit according to some embodiments of the present disclosure. A logic circuit 300 shown in FIG. 3 is a flip-flop. As shown in FIG. 3, the flip-flop 300 according to this embodiment may include the circuit unit according to any one of the foregoing embodiments (here, the circuit unit 200 shown in FIG. 2 is used as an example for description), an input stage 301, and an intermediate stage 303. As shown above, the circuit unit 200 includes the output stage 205, the node A, and the feedback stage 207.

The input stage 301 receives an input D and provides an output to an input of the intermediate stage 303. Here, the input stage 301 is implemented as a transmission gate that includes CMOS transistors 531 and 533. The PMOS transistor and the NMOS transistor respectively receive one of the first clock signal and the second clock signal. Here, the PMOS transistor and the NMOS transistor respectively receive the clock signal CLKP and the clock signal CLKN.

The intermediate stage 303 is connected between the circuit unit 200 and the input stage 301, and receives an output of the input stage 301 as an input, and provides an output to the node A. The intermediate stage 303 also receives clock signals CLKP and CLKN. Preferably, the intermediate stage 303 is implemented as three-state logic that presents a logic high state, a logic low state, and a high impedance state according to the input D (transmitted via the transmission gate 301) and the first clock signal (CLKP or CLKN) and the second clock signal (CLKN or CLKP).

In a preferred embodiment, as shown in FIG. 3, the intermediate stage 303 is implemented as a CMOS three-state gate including four transistors. The CMOS three-state gate includes transistors 541, 543, 545, and 547 that are serially connected in sequence, wherein the transistors 541 and 543 are PMOS transistors and the transistors 545 and 547 are NMOS transistors.

The transistors 541 and 543 are connected in series with each other, and one terminal (here, a source) of the transistor 543 is connected to one terminal (here, a drain) of the transistor 541. The control terminal (gate) of one of the transistors 541 and 543 is connected to the output of the input stage 301, and the control terminal (gate) of the other of the transistors 541 and 543 is connected to one of the clock signals (here, the clock signal CLKN). Preferably, as shown in FIG. 3, the gate of the transistor 541 is connected to the output of the input stage 301, and the gate of the transistor 543 is connected to the clock signal CLKN. One terminal of transistor 541 (here, a source) is connected to the supply voltage VDD.

The drain of the PMOS transistor 543 and the drain of the NMOS transistor 545 are connected to each other, and are connected to the node A. The transistors 545 and 547 are connected in series with each other. One terminal (here, a source) of the transistor 545 is connected to one terminal (here, the drain) of the transistor 547. The control terminal (gate) of one of the transistors 545 and 547 is connected to the output of the input stage 301, and the control terminal (gate) of the other of the transistors 545 and 547 is connected to the other of the clock signals (here, the clock signal CLKP). Preferably, as shown in FIG. 3, the gate of the transistor 547 is connected to the output of the input stage 301, and the gate of the transistor 545 is connected to the clock signal CLKP. Another terminal of the transistor 547 (here, a source) is connected to a low potential Vss.

It will be easily understood by a person skilled in the art that there are many implementations of the three-state logic used to implement the intermediate stage 303, but the implementations are not limited to the manners shown in FIG. 3. For example, the three-state logic may further be implemented to include an inverter and a transmission gate. In addition, in other embodiments, signals received by the gates of the transistors 541 and 543 may be exchanged, and correspondingly, signals received by the gates of the transistors 545 and 547 may also be exchanged. That is, the gates of the transistors 541 and 547 may be configured to be connected to the clock signals CLKN and CLKP, respectively, and the gates of the transistors 543 and 545 may be configured to be connected to the output of input stage 301.

The output stage 205 receives a signal (e.g., a voltage) at the node A as an input, and its output is used as an output Q. In this embodiment, the output Q is in phase with the input D. Therefore, the logic circuit 300 is a non-inverting flip-flop.

The feedback stage 207 may receive the output terminal Q as an input and provide feedback to the node A. When the enable signal EN is valid, for example, the signal EN is logic high and the signal $\overline{EN}$ is logic low, the NMOS transistor 522 and the PMOS transistor 525 can be turned on. This is equivalent to that the switch 108 shown in FIG. 1 is closed (turned on). In this case, the feedback stage 207 can provide feedback based on the first clock signal, the second clock signal, and the output signal Q. On the other hand, when the enable signal EN is invalid, for example, the signal EN is logic low (0) and the signal $\overline{EN}$ is logic high (1), the NMOS transistor 522 and the PMOS transistor 525 are cut off (turned off). This is equivalent to that the switch 108 shown in FIG. 1 is opened (turned off). In this case, the feedback stage 207 presents a high impedance state and therefore does not provide feedback to the node A.

According to embodiments of the present disclosure, when EN=0 (logic low), the transmission gate 301, the three-state gate 303, and the output stage 205 comprise a dynamic D flip-flop. In this case, the feedback stage is not involved in the operation of the circuit (here, the dynamic D flip-flop), and the overall circuit can operate in a high-performance mode. When CKLP=0 and CKLN=1 (logic high), the three-state gate 303 is turned off, and in this case, A is an internal node whose potential is suspended, and a signal voltage is stored by using a parasitic capacitor at A.

When EN=1, the feedback stage is valid. In this case, when CKLP=0 and CKLN=1, a signal at the node A may be latched by using a feedback stage, and there is no problem of minimum operating frequency, so that the circuit can operate in a low frequency and energy saving mode.

According to embodiments of the present disclosure, a problem of a minimum operating frequency limitation on a flip-flop and so on for example in a related technology may be resolved, and a circuit may still operate in a form of a dynamic D flip-flop in a high-performance mode. In a power saving mode or other special modes, the circuit can operate at any low frequency.

Figure 4:
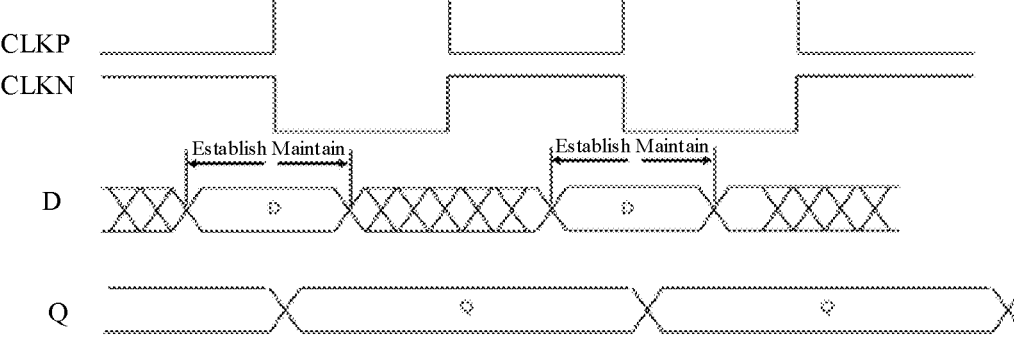
FIG. 4 shows a schematic timing diagram of a flip-flop according to some embodiments of the present disclosure.

FIG. 4 shows a schematic timing diagram of a signal of a flip-flop according to embodiments of the present disclosure. The following is described with reference to FIG. 3 and FIG. 4. The clock signals CLKN and CLKP may be obtained from, for example, a system clock. For example, without considering a delay, the clock signal CLKP and the clock signal CLKN are inverted from each other, and one of the clock signals CLKP and CLKN may be basically consistent with a clock signal CK. For example, here, the clock signal CLKP is basically the same as the clock signal CK, and the clock signal CLKN is an inverse of the clock signal CLKP (or the clock signal CK).

At an edge of the clock signal (here, a rising edge of CLKP), the flip-flop is triggered so that the output Q changes according to a change of the input D. The input D needs to be maintained for a specific setting time before the rising edge of the clock signal CLKP, and the input D needs to be maintained for a specific holding time after the rising edge of the clock signal CLKP.

Figure 5:
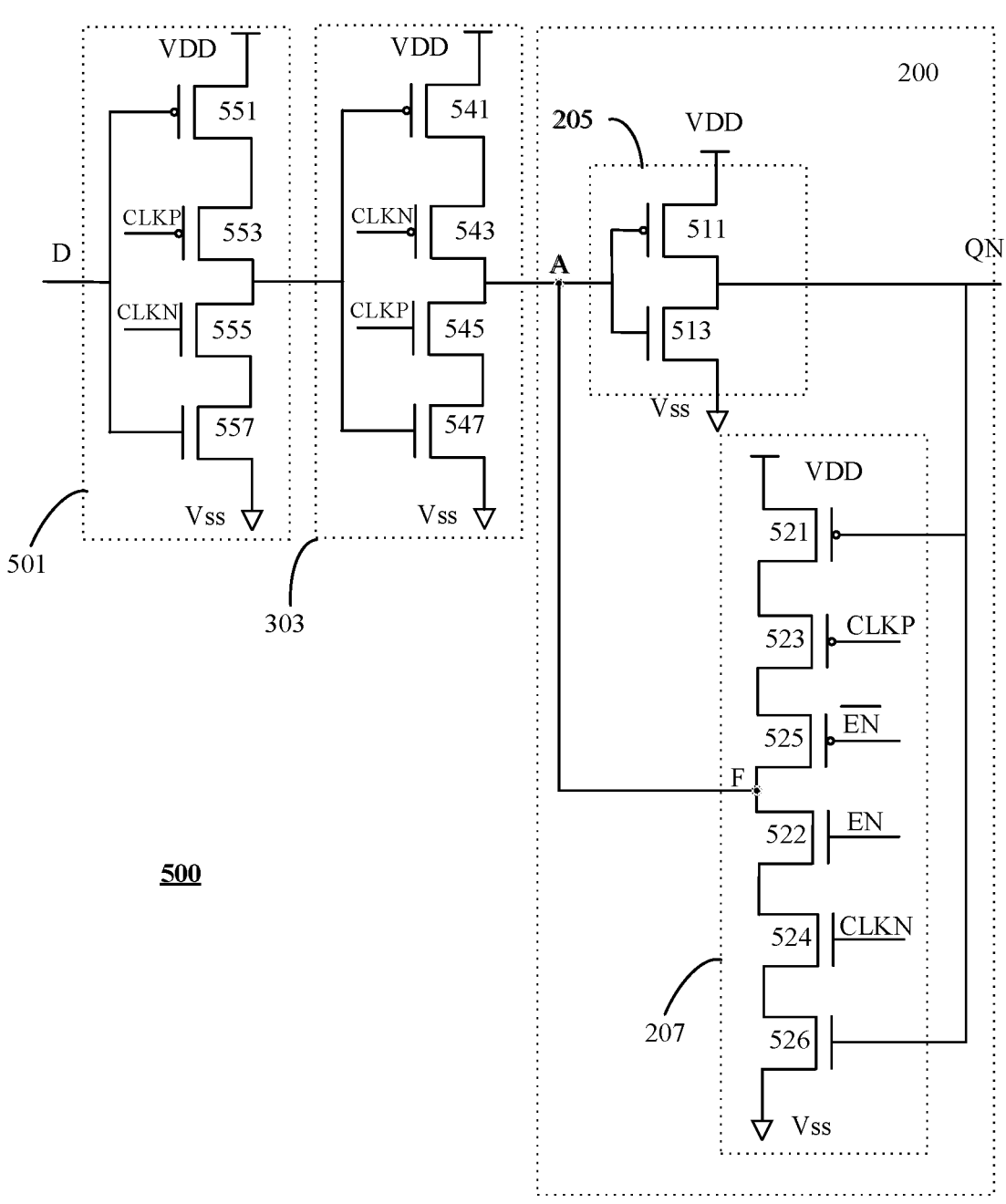
FIG. 5 shows a schematic circuit diagram of an inverting flip-flop according to some embodiments of the present disclosure.

FIG. 5 shows a schematic circuit diagram of an inverting flip-flop according to some embodiments of the present disclosure. A difference between a flip-flop 500 shown in FIG. 5 and the flip-flop shown in FIG. 3 lies only in different input stages. The input stage 301 of the flip-flop 300 in FIG. 3 is implemented as a transmission gate, and an input stage 501 of the flip-flop 500 in FIG. 5 is implemented as three-state logic.

The input stage 501 is implemented as a CMOS three-state gate including four transistors. The CMOS three-state gate includes transistors 551, 553, 555, and 557 that are serially connected in sequence, wherein the transistors 551 and 553 are PMOS transistors, and the transistors 555 and 557 are NMOS transistors.

The transistors 551 and 553 are connected in series with each other, and one terminal (here, a source) of the transistor 553 is connected to one terminal (here, a drain) of the transistor 551. A control terminal (gate) of one of the transistors 551 and 553 is connected to the input D, and a control terminal (gate) of the other of the transistors 551 and 553 is connected to one of the clock signals (here, the clock signal CLKP). Preferably, as shown in FIG. 5, the gate of the transistor 551 is connected to the input D, and the gate of the transistor 553 is connected to the clock signal CLKP. One terminal of the transistor 551 (here, a source) is connected to the supply voltage VDD.

The drain of the PMOS transistor 553 and the drain of the NMOS transistor 555 are connected to each other, and are connected to the intermediate stage 303. The transistors 555 and 557 are connected in series with each other. One terminal (here, a source) of the transistor 555 is connected to one terminal (here, a drain) of the transistor 557. A control terminal (gate) of one of the transistors 555 and 557 is connected to the input D, and a control terminal (gate) of the other of the transistors 555 and 557 is connected to the other of the clock signals (here, the clock signal CLKN). Preferably, as shown in FIG. 5, the gate of the transistor 557 is connected to the input D, and the gate of the transistor 555 is connected to the clock signal CLKN. The other terminal of the transistor 557 (here, a source) is connected to a low potential Vss.

The logic circuit shown in FIG. 5 constitutes an inverting flip-flop, that is, its output is inverted from the corresponding input D. Therefore, the output of the flip-flop is represented by $Q_N$ here.

Figure 6A:
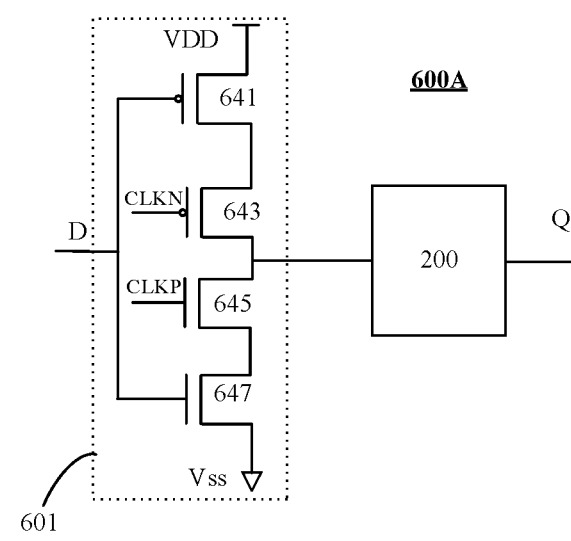
FIG. 6A and FIG. 6B show schematic diagrams of a non-inverting latches according to an embodiment of the present disclosure.
Figure 6B:
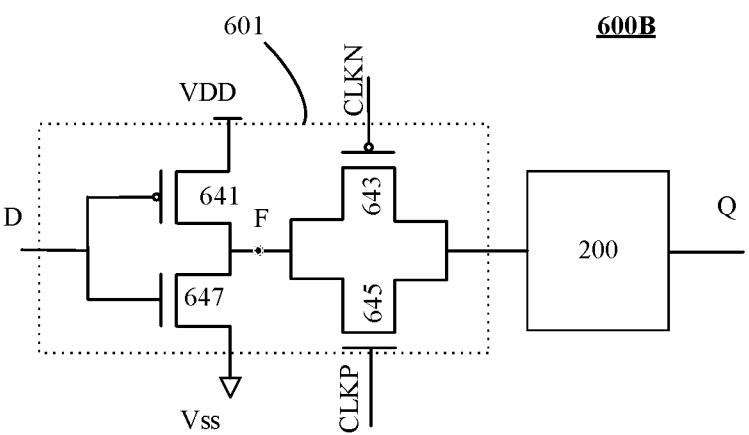

FIG. 6A and FIG. 6B show schematic diagrams of non-inverting latches according to embodiments of the present disclosure. A logic circuit 600A according to the embodiment shown in FIG. 6A constitutes a non-inverting latch. As shown in FIG. 6A, the logic circuit 600A includes a circuit unit according to any embodiment of the present disclosure. Here, the circuit unit 200 is used as an example. The logic circuit 600A also includes an input stage 601. Here, as shown in the figure, the input stage 601 is implemented as three-state logic. In some embodiments, as shown in FIG. 6A, the three-state logic is implemented as a three-state gate that includes CMOS transistors 641, 643, 645, and 647 that are serially connected to each other. A control terminal (gate) of one of the transistors 641 and 643 (here, the transistor 641) is connected to the input D, and a control terminal (gate) of the other of the transistors 641 and 643 is connected to one of the clock signals (here, the clock signal CLKN). A control terminal (gate) of one of the transistors 645 and 647 (here, the transistor 647) is connected to the input D, and a control terminal (gate) of the other of the transistors 645 and 647 is connected to the other of the clock signals (here, the clock signal CLKP).

A logic circuit 600B shown in FIG. 6B is basically the same as the logic circuit 600A shown in FIG. 6A, except that the three-state logic of the input stage 601 is implemented as an inverter and a transmission gate that are serially connected. CMOS transistors 641 and 647 form an inverter that receives the input D and provides an inverted output to the transmission gate. CMOS transistors 643 and 645 form the transmission gate, and their control terminals are respectively connected to the clock signals CLKN and CLKP that are inverted to each other. The transmission gate provides a signal to the node A of the circuit unit 200 according to control of the clock signals CLKN and CLKP.

It should be noted that a person skilled in the art will easily understand that the three-state gates 303, 501, and the like described above in relation to FIG. 3 and FIG. 5 may also be similarly implemented as an inverter and a transmission gate that are serially connected. Therefore, details are not described here.

Figure 7:
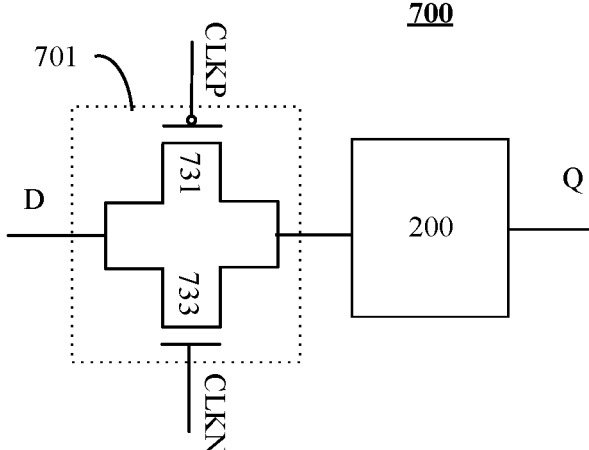
FIG. 7 shows a schematic diagram of an inverting latch according to some embodiments of the present disclosure.

FIG. 7 shows a schematic diagram of an inverting latch according to some embodiments of the present disclosure. A logic circuit 700 according to the embodiment shown in FIG. 7 constitutes an inverting latch. As shown in FIG. 7, the logic circuit 700 includes a circuit unit according to any embodiment of the present disclosure. Here, the circuit unit 200 is used as an example. The logic circuit 700 also includes an input stage 701. Here, as shown in the figure, the input stage 701 is implemented as a transmission gate. As shown in FIG. 7, CMOS transistors 731 and 733 form the transmission gate, and control terminals of the two are respectively connected to clock signals CLKP and CLKN that are inverted to each other. The transmission gate provides the input D to the node A of the circuit unit 200 according to control of the clock signals CLKN and CLKP.

Figure 8A:
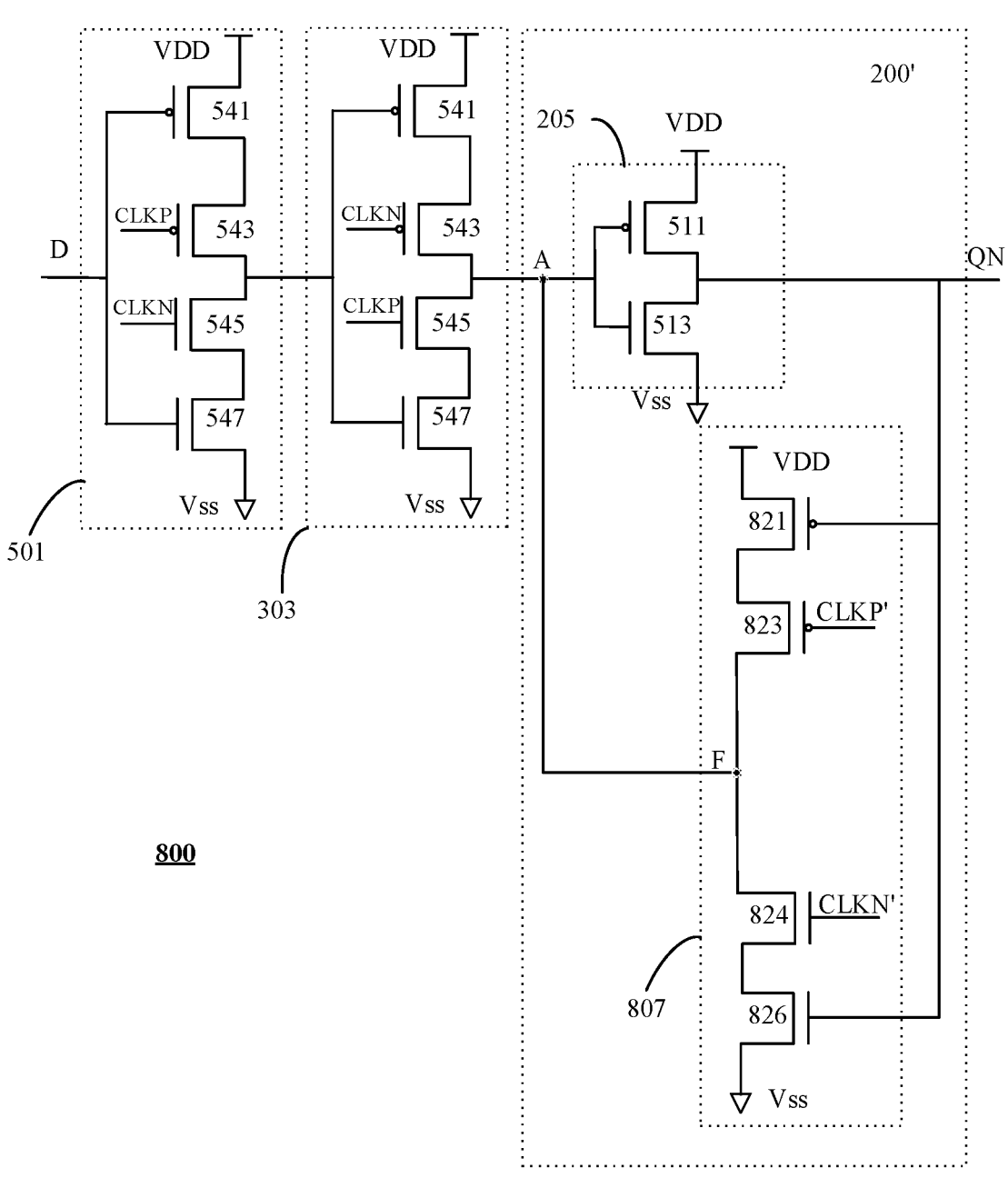
FIG. 8A shows a schematic circuit diagram of a flip-flop according to another embodiment of the present disclosure.

FIG. 8A shows a schematic circuit diagram of a flip-flop according to another embodiment of the present disclosure. A logic circuit 800 shown in FIG. 8A is similar to the logic circuit 500 shown in FIG. 5, and a difference lies only in a difference between a feedback stage of a circuit unit 200' and a feedback stage of a circuit unit 200.

In the embodiment shown in FIG. 8A, the circuit unit 200' includes an output stage 205 and a feedback stage 807. The output stage 205 may be consistent with the output stage 205 described with reference to FIG. 2, FIG. 5, and the like. Here, the output stage 205 is implemented as an inverter that receives the signal at the node A as an input and provides an output to an output terminal $Q_N$. The output stage 205 includes CMOS transistors 511 and 513 that are serially connected to each other. The transistor 511 is a PMOS transistor, and the transistor 513 is an NMOS transistor. A control terminal (gate) of the transistor 511 is connected to the node A, its source is connected to a supply voltage VDD, and its drain is connected to a drain of the transistor 513 and is connected to the output terminal Q. A gate of the transistor 513 is connected to the node A, and its source is connected to a low-potential supply voltage Vss (for example, ground).

The difference is that here the feedback stage 807 is implemented as three-state logic controlled by additionally provided clocks signals CLKP' and CLKN'. Here, the clock signal CLKP' and the clock signal CLKN' are inverses of each other. Here, different from the foregoing clock signal CLKP and clock signal CLKN, instead, the clock signal CLKP' and the clock signal CLKN' are set as a logical combination of a clock signal (for example, a system clock or a reference clock CK) and an enable signal EN, so that a function of the clock and a function of the enable signal EN/ $\overline{EN}$ in the foregoing embodiment can be both implemented by using the clock signal CLKP' and the clock signal CLKN'.

The feedback stage 807 functions as three-state logic and has a logic high state, a logic low state, and a high impedance state. In the embodiment shown in FIG. 8A, the feedback stage 807 is implemented as a three-state gate. The three-state gate 807 includes transistors 821, 823, and 824, 826 that are serially connected in sequence. The transistors 821 and 823 are transistors of a first conductivity type (for example, a P-type), and the transistors 824 and 826 are transistors of a second conductivity type (for example, an N-type) that has a different conductivity type.

The transistors 821 and 823 are connected in series with each other, and one terminal (here, a source) of the transistor 823 is connected to one terminal (here, a drain) of the transistor 821. A control terminal (gate) of one of the transistors 821 and 823 is connected to the output terminal $Q_N$, and a control terminal (gate) of the other of the transistors 821 and 823 is connected to one of the clock signals (here, the clock signal CLKP'). Here, the clock signal CLKP' may be configured as a result of logic AND of the clock signal CK and the enable signal EN, that is, CKLP'=CK&EN. Preferably, as shown in FIG. 8A, the gate of the transistor 821 is connected to the output terminal $Q_N$, and the gate of the transistor 823 is connected to the clock signal CLKP'. One terminal of the transistor 821 (here, a source) is connected to the supply voltage VDD.

A drain of the PMOS transistor 823 and a drain of the NMOS transistor 824 are connected to each other, and are connected to the node A. The transistors 824 and 826 are connected in series with each other. One terminal (here, a source) of the transistor 824 is connected to one terminal (here, a drain) of the transistor 826. A control terminal (gate) of one of the transistors 824 and 826 is connected to the output terminal $Q_N$, and a control terminal (gate) of the other of the transistors 824 and 826 is connected to the other of the clock signals (here, the clock signal CLKN'). Here, the clock signal CLKN' may be configured as a result of combination logic of the clock signal CK and the enable signal EN, for example, may be set as: CKLN'=$\overline{CK+EN}$=$\overline{CLKP'}$. Preferably, as shown in FIG. 8A, the gate of the transistor 826 is connected to the output terminal $Q_N$, and the gate of the transistor 824 is connected to the clock signal CLKN'. The other terminal of the transistor 826 (here, a source) is connected to a low potential Vss.

Here, when the clock signal CLKP' is high, the clock signal CLKN' is low, and the transistors 823 and 824 are turned off. Therefore, the three-state gate 807 presents a high impedance state and provides no feedback to the node A. When the clock signal CLKP' is low, the clock signal CLKN' is high, and the transistors 823 and 824 can be turned on. Therefore, the three-state gate 807 provides feedback to the node A according to the output $Q_N$, so that the signal at the node A is maintained (or latched).

Here, it should be further understood that the combination logic of the clock signal CLKP' and the clock signal CLKN' is merely exemplary rather than limiting. A person skilled in the art may obviously select any other suitable combination logic according to a requirement according to a principle of the teachings of the present disclosure.

Figure 8B:
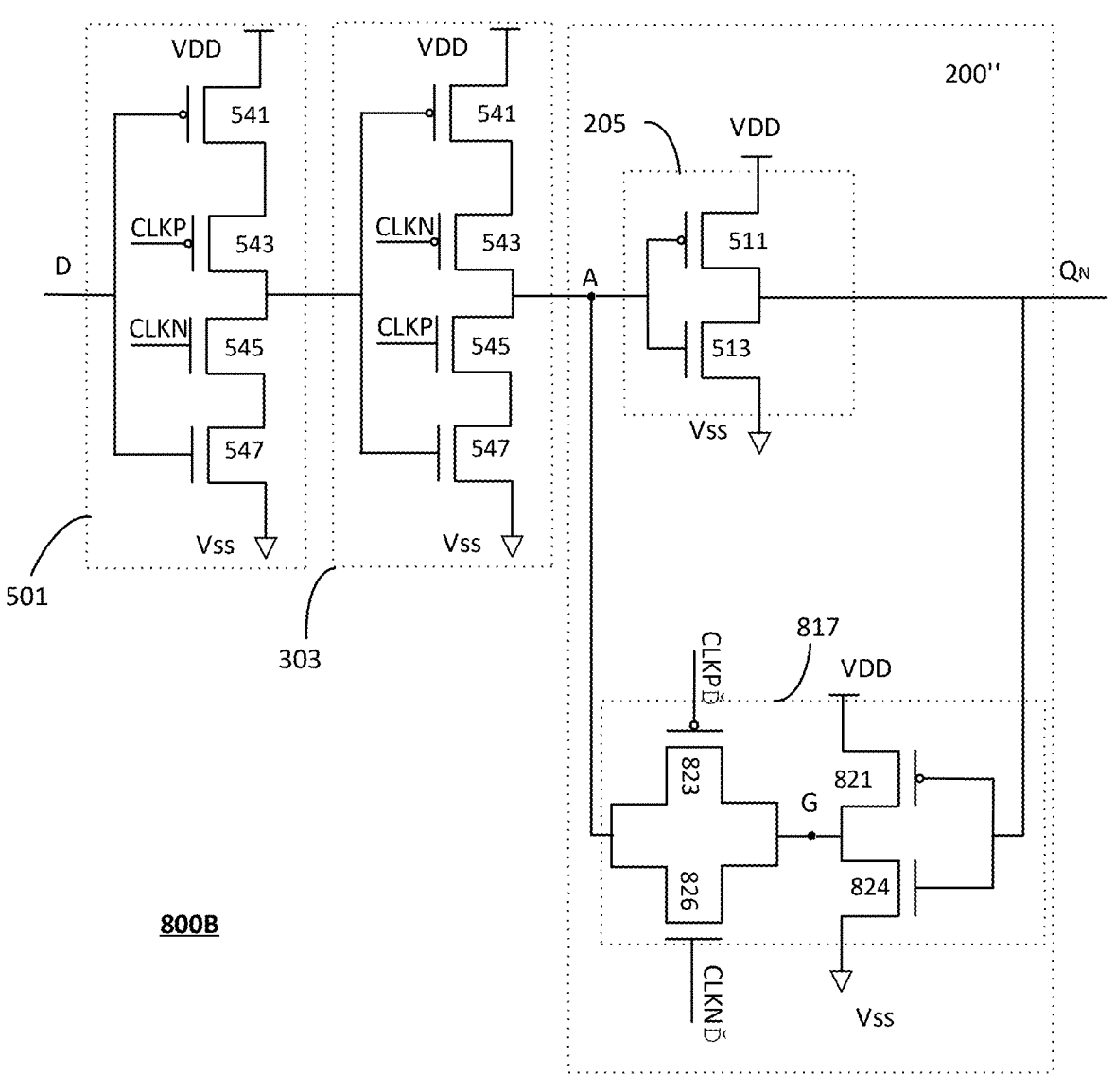
FIG. 8B shows a schematic circuit diagram of a flip-flop according to still another embodiment of the present disclosure.

FIG. 8B shows a schematic circuit diagram of a flip-flop according to another embodiment of the present disclosure. A logic circuit 800B shown in FIG. 8B is similar to the logic circuit 800 shown in FIG. 8A, and a difference lies only in a feedback stage of the circuit unit 200" and a feedback stage of the circuit unit 200' of the two. In the embodiment shown in FIG. 8A, the feedback stage 807 is implemented as a three-state gate. In the embodiment shown in FIG. 8B, the feedback stage 817 is implemented as a combination of an inverter and a transmission gate that are serially connected.

As shown in FIG. 8B, CMOS transistors 821 and 824 constitute an inverter, and CMOS transistors 823 and 826 constitute a transmission gate. An input of the inverter is connected to the output terminal $(Q_N)$, and an output of the inverter is connected to an input of the transmission gate (node G). An output of the transmission gate is connected to an intermediate node (node A). Two control terminals of the transmission gate (that is, gates of the CMOS transistors 823 and 826) receive the clock signal CLKP' and the clock signal CLKN', respectively. Here, as an example, the gate of the P-type transistor 823 receives the clock signal CLKP', and the gate of the N-type transistor 826 receives the clock signal CLKN'.

An operation of the logic circuit 800B shown in FIG. 8B is basically the same as an operation of the logic circuit 800 shown in FIG. 8A. The foregoing content described in FIG. 8A may be similarly or adaptively applied to the embodiment in FIG. 8B. Therefore, description is not repeated here. In addition, likewise, in the embodiment shown in FIG. 8B, the node G may be used as an output to output an inverse Q of the flip-flop output $Q_N$.

A person skilled in the art further understands that, although the transistor device in the circuit unit is designed to have a same threshold, a variation in a process manufacturing procedure may cause a deviation in a threshold of an actually manufactured device. Generally, in this specification, a substantially same threshold may be represented as being within a range of ±20% of a design threshold or a target threshold, more preferably within a range of ±15%, more preferably within a range of ±10%, and more preferably within a range of ±5%.

According to the circuit units in the embodiments of the present disclosure, a problem of a minimum operating frequency limitation of a circuit such as a flip-flop in a related technology can be resolved, and the circuit can still operate normally in a high-performance mode. In a power saving mode or other special modes, the circuit can operate at any low frequency.

In addition, according to the circuit units in the embodiments of the present disclosure, because the potential of the floating node can be effectively maintained, even when the circuit unit operates at relatively low frequency, a malfunction does not occur. The circuit units according to the embodiments of the present disclosure can also operate at relatively high frequency, thereby providing flexibility for a processor design and reducing power consumption.

It should be further understood that, although the foregoing embodiments in which the rising edge or the high level is valid are described in the foregoing examples, in other embodiments of the present disclosure, a falling edge or a low level being valid may be used for implementation. In this case, waveforms of the clock signals CLKN and CLKP are reversed.

Figure 9:
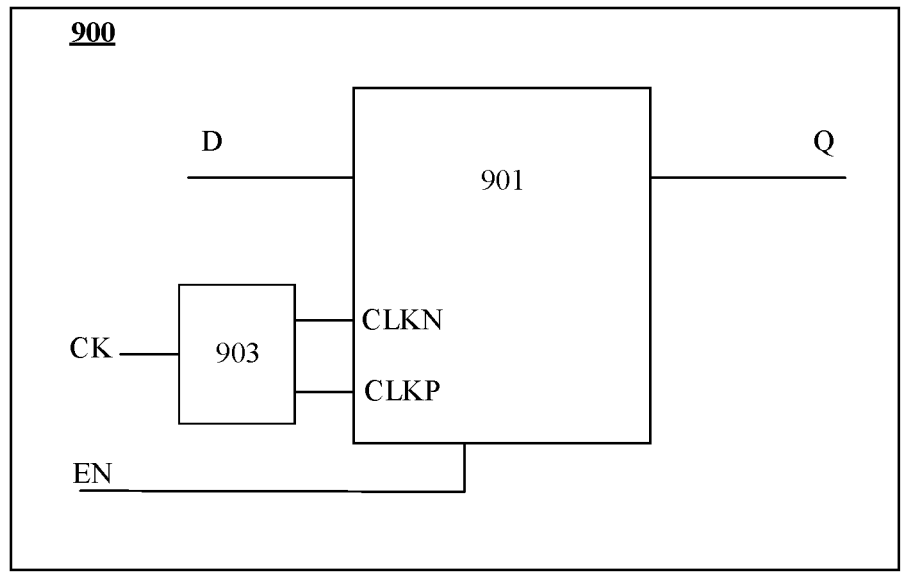
FIG. 9 shows a schematic block diagram of a processor including a clock circuit and a logic circuit according to some embodiments of the present disclosure.

According to the present disclosure, a processor is further provided. FIG. 9 shows a schematic block diagram of a processor including a clock circuit and a circuit unit according to some embodiments of the present disclosure. As shown in FIG. 9, a processor 900 includes at least one circuit 901. The circuit 901 may be a circuit unit or a logic circuit according to any embodiment of the present disclosure. The processor 900 may further include a clock circuit 903, which is configured to provide a required clock signal to each circuit unit. As shown in FIG. 9, the clock circuit 903 receives a clock signal CK (which may be a system clock or a clock signal received from the outside), and outputs different clock signals, for example, CLKN and CLKP. In this embodiment, the circuit 901 further receives an enable signal EN. In other embodiments, the enable signal EN may be received through the clock circuit 903, and a corresponding clock signal (e.g., clock signals CLKN' and CLKP') as a combination of the clock signal CK and the enable signal EN may be provided based on the received clock CK (e.g., a system clock) and the enable signal EN.

Figure 10:
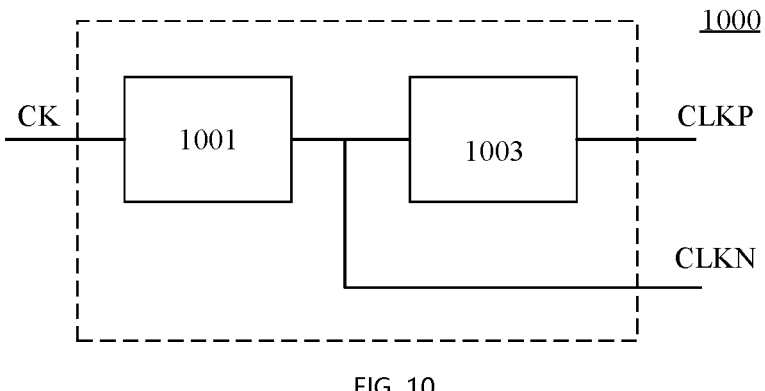
FIG. 10 shows a schematic block diagram of a clock circuit according to some embodiments of the present disclosure.

FIG. 10 shows a schematic block diagram of a clock circuit according to some embodiments of the present disclosure. A clock circuit 1000 includes a first inverter 1001 and a second inverter 1003 that are connected in series. The first inverter 1001 receives a clock signal (for example, a system clock), and outputs a first clock signal (for example, a clock signal CLKN or CLKP). The second inverter receives the first clock signal, and outputs a second clock signal (for example, the clock signal CLKP or CLKN). In this way, the first clock signal and the second clock signal are inverted from each other. The first clock signal and the second clock signal may be provided to one or more of a plurality of circuit units.

Figure 11:
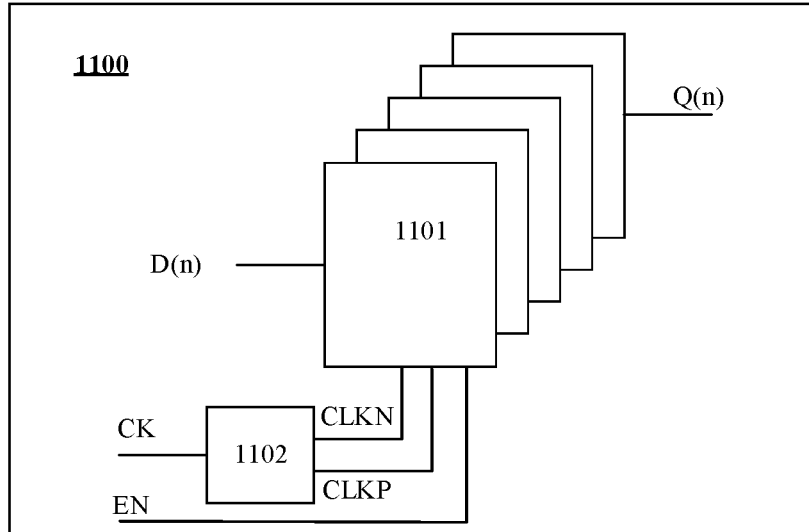
FIG. 11 shows a schematic block diagram of a processor including a clock circuit and a plurality of logic circuits according to some embodiments of the present disclosure.

FIG. 11 is a schematic block diagram of a processor including a clock circuit and a plurality of circuit units according to some embodiments of the present disclosure. As shown in FIG. 11, a processor 1100 includes a plurality of circuit units 1101 and a clock circuit 1102 that provides clock signals for the plurality of circuit units 1101. The circuit 1101 may be a circuit unit or a logic circuit according to any embodiment of the present disclosure. The clock circuit 1102 receives a clock CK and outputs clock signals CLKN and CLKP to each circuit unit 1101. The clock circuit 1102 may be, for example, the clock circuit shown in FIG. 9. Each circuit unit 1101 also receives an enable signal EN.

Figure 12:
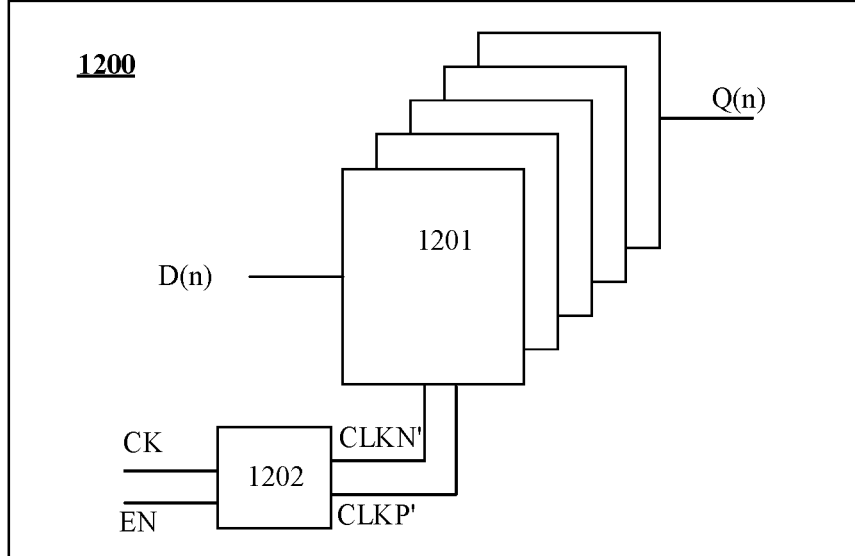
FIG. 12 shows a schematic block diagram of a processor including a clock circuit and a plurality of logic circuits according to some other embodiments of the present disclosure.

FIG. 12 shows a schematic block diagram of a processor including a clock circuit and a plurality of logic circuits according to some other embodiments of the present disclosure. As shown in FIG. 12, a processor 1200 includes a plurality of circuit units 1201 and a clock circuit 1202 that provides clock signals for the plurality of circuit units 1201. The circuit unit 1201 may be a circuit unit or a logic circuit according to any embodiment of the present disclosure. Different from the embodiment shown in FIG. 11, here the clock circuit 1202 receives a clock CK and an enable signal EN, and outputs clock signals CLKN' and CLKP' to each circuit unit 1201. As described above with reference to FIG. 8A, as an example, the clock signals CLKN' and CLKP' may be configured as the following logical results: CLKN'=$\overline{CK}$+ $\overline{EN}$, CLKP'=CK&EN. However, it should be understood that the configuration is merely exemplary. A person skilled in the art may easily set according to a requirement according to a principle of the present disclosure.

According to this embodiment, a clock control logic and a clock driver may be shared, and a set of clock drivers with control logic may be used to simultaneously provide clock signals CLKP' and CLKN' to a plurality of parallel circuit units or logic circuits (for example, a flip-flop or a latch disclosed here and so on). This can reduce quantities of clock buffers and control logic, further reducing a chip area and power consumption.

Figures 13, 14:
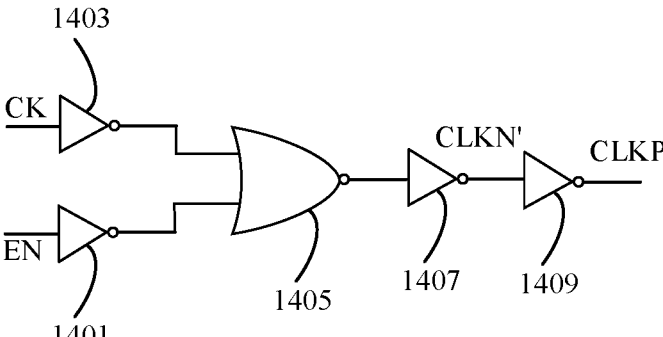
FIG. 13 shows a clock circuit for used in some embodiments according to the present disclosure.
FIG. 14 shows a clock circuit for used in some other embodiments according to the present disclosure.

FIG. 13 shows a clock logic circuit for some embodiments according to the present disclosure as an example of a logic implementation that may be used to implement the clock signals CLKP' and CLKN' described above. The clock logic circuit includes a NAND gate 1301, a NOT gate 1303, and a NOT gate 1305 that are cascaded.

FIG. 14 shows a clock logic circuit for some other embodiments according to the present disclosure as another example of a logic implementation that may be used to implement the clock signals CLKP' and CLKN' described above. The clock logic circuit includes a NOR gate 1405, a NOT gate 1407, and a NOT gate 1409 that are cascaded. The NOR gate 1405 receives an inverse of a clock signal CK (via the NOT gate 1403) and an inverse of an enable signal EN (via the NOT gate 1401).

A person skilled in the art will understand that logic circuits used to implement the clock signals CLKP' and CLKN' may be diversified, and are not listed one by one here. A person skilled in the art may provide various logic circuits to provide a suitable control signal to control a feedback stage based on a clock signal (for example, but not limited to CK) and a control signal (for example, EN) according to the teachings of the present disclosure.

According to the present disclosure, a computing apparatus is further provided, and may include a processor according to any embodiment of the present disclosure. In some embodiments, the computing apparatus may be a computing apparatus for a digital currency. The digital currency may be, for example, digital RMB, bitcoin, ETH, or Litecoin.

A person skilled in the art should be aware that the boundary between the operations (or steps) described in the foregoing embodiments is merely illustrative. A plurality of operations may be combined into a single operation, the single operation may be distributed in an additional operation, and performing of the operations may be at least partially overlapped in time. Further, alternative embodiments may include a plurality of instances of particular operations, and in other various embodiments, an operation sequence may be changed. However, other modifications, changes, and replacements are also possible. Therefore, this specification and the accompanying drawings should be considered as illustrative and not limiting.

Although some specific embodiments of the present disclosure have been described in detail by way of example, a person skilled in the art should understand that the foregoing examples are only for description, and are not intended to limit the scope of the present disclosure. The embodiments disclosed here may be randomly combined without departing from the spirit and scope of the present disclosure. A person skilled in the art should further understand that a plurality of modifications may be made to the embodiments without departing from the scope and spirit of the present disclosure. The scope of the present disclosure is defined by the appended claims.

What is claimed is:

1. A circuit unit, including:
an output terminal;
an output stage, configured to provide an output signal to the output terminal;
a first node, wherein an input of the output stage is connected to the first node; and
a feedback stage that receives the output signal at the output terminal and selectively provides feedback to the first node,
wherein the feedback stage operates based on clock signals and an enable signal, and
wherein the enable signal is set such that: when the enable signal is valid, the feedback stage can provide feedback based on the clock signals and the output signal; and when the enable signal is invalid, the feedback stage presents a high impedance state and therefore does not provide feedback, and the circuit unit operates as a dynamic latch or a dynamic flip-flop.

2. The circuit unit according to claim 1, wherein the clock signals include a first clock signal and a second clock signal, and the first clock signal is an inverse of the second clock signal;
wherein the feedback stage has a logic high state, a logic low state, and a high impedance state;
and
wherein an output of the output stage is inverted to the input of the output stage.

3. The circuit unit according to claim 2, wherein the feedback stage includes a three-state gate, and the three-state gate includes:
first to sixth transistors serially connected in sequence, wherein the first transistor, the second transistor, and the third transistor are transistors of a first conductivity type, the fourth transistor, the fifth transistor, and the sixth transistor are transistors of a second conductivity type, and the second conductivity type is different from the first conductivity type;
wherein in the first transistor, the second transistor, and the third transistor, a control terminal of one of the transistors is connected to the output terminal, a control terminal of a different one of the transistors is connected to one of the first clock signal and the second clock signal, and a control terminal of another different one of the transistors is connected to one of the enable signal and an inverse of the enable signal;
wherein in the fourth transistor, the fifth transistor, and the sixth transistor, a control terminal of one of the transistors is connected to the output terminal, a control terminal of a different one of the transistors is connected to the other one of the first clock signal and the second clock signal, and a control terminal of another different one of the transistors is connected to the other one of the enable signal and the inverse of the enable signal; and
wherein a second node at which the third transistor and the fourth transistor are connected to each other is connected to the first node.

4. The circuit unit according to claim 3, wherein the first conductivity type is P-type, and the second conductivity type is N-type.

5. The circuit unit according to claim 2, wherein the feedback stage includes a three-state gate and a transmission gate that are serially connected;
an input of the three-state gate is connected to the output terminal, an output of the three-state gate is connected to an input of the transmission gate, and an output of the transmission gate is connected to the first node;

two control terminals of the transmission gate respectively receive the first clock signal and the second clock signal;

the three-state gate includes:

seventh to tenth transistors serially connected in sequence, wherein the seventh transistor and the eighth transistor are transistors of a first conductivity type, and the ninth transistor and the tenth transistor are transistors of a second conductivity type;

wherein a control terminal of one of the seventh transistor and the eighth transistor is connected to the output terminal, and a control terminal of the other of the seventh transistor and the eighth transistor is connected to one of the enable signal and an inverse of the enable signal;

wherein a control terminal of one of the ninth transistor and the tenth transistor is connected to the output terminal, and a control terminal of the other of the ninth transistor and the tenth transistor is connected to the other of the enable signal and the inverse of the enable signal; and wherein a nodes at which the eighth transistor and the ninth transistor are connected to each other is connected to the input of the transmission gate.

6. The circuit unit according to claim 1, wherein the clock signals include a third clock signal (CLKP') and a fourth clock signal (CLKN'), and the third clock signal is an inverse of the fourth clock signal, wherein each of the third clock signal and the fourth clock signal is a logical combination of a system clock or a reference clock and the enable signal;

wherein the feedback stage has a logic high state, a logic low state, and a high impedance state; and wherein an output of the output stage is inverted to the input of the output stage.

7. The circuit unit according to claim 6, wherein the feedback stage includes a three-state gate, and the three-state gate includes:

first to fourth transistors serially connected in sequence, wherein the first transistor and the second transistor are transistors of a first conductivity type, and the third transistor and the fourth transistor are transistors of a second conductivity type, wherein the second conductivity type is different from the first conductivity type;

wherein a control terminal of one of the first transistor and the second transistor is connected to the output terminal, and a control terminal of the other of the first transistor and the second transistor is connected to the third clock signal;

wherein a control terminal of one of the third transistor and the fourth transistor is connected to the output terminal, and a control terminal of the other of the third transistor and the fourth transistor is connected to the fourth clock signal; and wherein a node at which the second transistor and the third transistor are connected to each other is connected to the first node.

8. The circuit unit according to claim 6, wherein the feedback stage includes an inverter and a transmission gate that are serially connected;

the inverter includes a first transistor of a first conductivity type and a fourth transistor of a second conductivity type that are connected in series, the transmission gate includes a second transistor of the first conductivity type and a third transistor of the second conductivity type that are connected in parallel, and the second conductivity type is different from the first conductivity type;

an input of the inverter is connected to the output terminal, an output of the inverter is connected to an input of the transmission gate, and an output of the transmission gate is connected to the first node; and two control terminals of the transmission gate respectively receive the third clock signal and the fourth clock signal.

9. A logic circuit, including:

an input stage, receiving a signal input; and the circuit unit according to claim 1, wherein the first node receives a signal based on an output of the input stage.

10. The logic circuit according to claim 9, further including:

an intermediate stage, disposed between the input stage and the circuit unit, wherein the intermediate stage receives an output of the input stage as an input, and provides an output to the first node.

11. The logic circuit according to claim 10, wherein the input stage includes:

three-state logic, wherein the three-state logic receives a signal input and first and second clock signals, and provides an output to the intermediate stage, and the three-state logic presents a logic high state, a logic low state, and a high impedance state according to the received signal input and the first and second clock signals.

12. The logic circuit according to claim 10, wherein the intermediate stage is three-state logic, the three-state logic receives the output of the input stage and the first clock signal and the second clock signal, and the three-state logic presents a logic high state, a logic low state, and a high impedance state according to the input and the first clock signal and the second clock signal.

13. The logic circuit according to claim 12, wherein the three-state logic of the intermediate stage includes an inverter and a transmission gate, the inverter receives the output of the input stage as an input, an output of the inverter is connected to one terminal of the transmission gate, the other terminal of the transmission gate is connected to the first node, and control terminals of the transmission gate separately receive the first and second clock signals.

14. The logic circuit according to claim 12, wherein the three-state logic of the intermediate stage includes a three-state gate, and the three-state gate includes:

eleventh to fourteenth transistors serially connected in sequence, wherein the eleventh and twelfth transistors are transistors of a first conductivity type, and the thirteenth and fourteenth transistors are transistors of a second conductivity type;

wherein a control terminal of one of the eleventh and twelfth transistors is connected to the output of the input stage, and a control terminal of the other of the eleventh and twelfth transistors is connected to one of the first and second clock signals;

wherein a control terminal of one of the thirteenth and fourteenth transistors is connected to the output of the input stage, and a control terminal of the other of the thirteenth and fourteenth transistors is connected to the other of the first and second clock signals; and wherein a node at which the twelfth and thirteenth transistors are connected to each other is connected to the first node.

15. The logic circuit according to claim 12, wherein the input stage includes the three-state logic, and the logic circuit is an inverting flip-flop.

16. The logic circuit according to claim 10, wherein the intermediate stage is three-state logic, the three-state logic receives the output of the input stage and first and second clock signals, and the three-state logic presents a logic high state, a logic low state, and a high impedance state according to the received output of the input stage and the first and second clock signals;

the input stage includes a transmission gate, one terminal of the transmission gate receives the signal input, the other terminal of the transmission gate is connected to the intermediate stage, and control terminals of the transmission gate separately receive the first and second clock signals; and the logic circuit is a non-inverting flip-flop.

17. The logic circuit according to claim 9, wherein the input stage includes three-state logic, and the three-state logic receives the signal input and first and second clock signals and provides an output to the first node;

wherein the three-state logic presents a logic high state, a logic low state, and a high impedance state according to the input and the first and second clock signals; and wherein the logic circuit is a non-inverting latch.

18. The logic circuit according to claim 9, wherein the input stage includes a transmission gate, one terminal of the transmission gate receives the signal input, the other terminal of the transmission gate is connected to the first node, and control terminals of the transmission gate separately receive first and second clock signals; and wherein the logic circuit is an inverting latch.

19. The logic circuit according to claim 9, wherein thresholds of transistors in the logic circuit are substantially the same.

20. A processor, including:

the circuit unit according to claim 1.

\* \* \* \* \*